(12) United States Patent
Shimogawara et al.

(10) Patent No.: US 10,658,602 B2
(45) Date of Patent: May 19, 2020

(54) ORGANIC EL ELEMENT PRODUCTION METHOD AND ORGANIC EL ELEMENT HAVING CONDUCTIVE MEMBER ON EXTERNAL CONNECTION AREA OF FIRST ELECTRODE

(71) Applicant: SUMITOMO CHEMICAL COMPANY, LIMITED, Tokyo (JP)

(72) Inventors: Masaya Shimogawara, Niihama (JP); Shinichi Morishima, Tsukuba (JP); Eiji Kishikawa, Niihama (JP); Masato Shakutsui, Niihama (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 16/072,236

(22) PCT Filed: Dec. 27, 2016

(86) PCT No.: PCT/JP2016/088956
§ 371 (c)(1),
(2) Date: Jul. 24, 2018

(87) PCT Pub. No.: WO2017/130625
PCT Pub. Date: Aug. 3, 2017

(65) Prior Publication Data
US 2019/0051851 A1    Feb. 14, 2019

(30) Foreign Application Priority Data

Jan. 26, 2016    (JP) ................. 2016-012630

(51) Int. Cl.
*H01L 51/50*    (2006.01)
*H01L 51/56*    (2006.01)
(Continued)

(52) U.S. Cl.
CPC ...... *H01L 51/5012* (2013.01); *H01L 51/5092* (2013.01); *H01L 51/5209* (2013.01);
(Continued)

(58) Field of Classification Search
CPC .............. H01L 51/5209; H01L 51/5203
See application file for complete search history.

(56) References Cited

U.S. PATENT DOCUMENTS

2005/0122043 A1*  6/2005  Kato ................... H01L 51/5203
                                                                      313/512
2013/0181205 A1   7/2013  Mima et al.
(Continued)

FOREIGN PATENT DOCUMENTS

| CN | 103119744 A | 5/2013 |
|---|---|---|
| CN | 103583083 A | 2/2014 |

(Continued)

OTHER PUBLICATIONS

International Preliminary Report on Patentability and Translation of Written Opinion, dated Aug. 9, 2018 from the International Bureau in counterpart International application No. PCT/JP2016/088956.
(Continued)

*Primary Examiner* — Michael Jung
(74) *Attorney, Agent, or Firm* — Sughrue Mion, PLLC

(57) ABSTRACT

A production method for an organic EL element includes a step of forming an organic EL section on an organic EL section arrangement area in a first electrode section while conveying an electrode-attached substrate in a first direction, a step of forming a band-shaped conductive film along the first direction to cover the organic EL section and at least a part of an external connection area in the first electrode section while conveying the electrode-attached substrate on which the organic EL section is formed in the first direction, and a step of forming a groove section that separates the
(Continued)

conductive film into a first part and a second part being a second electrode section by removing the conductive film in a predetermined area in a second direction while conveying the electrode-attached substrate on which the conductive film is formed in the first direction, and extends in the first direction.

13 Claims, 18 Drawing Sheets

(51) Int. Cl.
    *H01L 51/52*     (2006.01)
    *H05B 33/04*     (2006.01)
    *H05B 33/06*     (2006.01)
    *H05B 33/10*     (2006.01)
    *H05B 33/22*     (2006.01)

(52) U.S. Cl.
    CPC ...... *H01L 51/5212* (2013.01); *H01L 51/5225* (2013.01); *H01L 51/56* (2013.01); *H05B 33/04* (2013.01); *H05B 33/06* (2013.01); *H05B 33/10* (2013.01); *H05B 33/22* (2013.01); *H01L 51/5206* (2013.01); *H01L 51/5221* (2013.01); *H01L 2251/5361* (2013.01); *H01L 2251/566* (2013.01)

(56) References Cited

U.S. PATENT DOCUMENTS

2014/0186985 A1     7/2014     Kakiuchi et al.
2016/0072069 A1     3/2016     Takeuchi
2016/0343778 A1*   11/2016     Li ..................... H01L 51/5206
2019/0006614 A1*   1/2019     Kuroki ............. H01L 51/5212

FOREIGN PATENT DOCUMENTS

| | | |
|---|---|---|
| CN | 105165122 A | 12/2015 |
| EP | 1 536 491 A2 | 6/2005 |
| EP | 2 822 361 A1 | 1/2015 |
| EP | 2 849 534 A1 | 3/2015 |
| JP | 2004140003 A | 5/2004 |
| JP | 2012146608 A | 8/2012 |
| JP | 2012181931 A | 9/2012 |
| JP | 2013239355 A | 11/2013 |
| JP | 2014187283 A | 10/2014 |
| TW | 201230435 A1 | 7/2012 |
| WO | 2012081625 A1 | 6/2012 |
| WO | 2015129892 A1 | 9/2015 |

OTHER PUBLICATIONS

International Search Report dated Mar. 14, 2017 from the International Bureau in counterpart International application No. PCT/JP2016/088956.

Communication dated Aug. 22, 2019, from the European Patent Office in counterpart European Application No. 16888209.0.

Communication dated Jul. 31, 2019, from the China National Intellectual Property Administration in counterpart Application No. 201680079883.7.

Notice of Reasons for Rejection dated Oct. 29, 2019 issued by the Japanese Patent Office in counterpart application No. 2016-012630.

* cited by examiner (a)

(b)

(a)

(b)

ORGANIC EL ELEMENT PRODUCTION METHOD AND ORGANIC EL ELEMENT HAVING CONDUCTIVE MEMBER ON EXTERNAL CONNECTION AREA OF FIRST ELECTRODE

CROSS REFERENCE TO RELATED APPLICATIONS

This application is a National Stage of International Application No. PCT/JP2016/088956 filed Dec. 27, 2016, claiming priority based on Japanese Patent Application No. 2016-012630, filed Jan. 26, 2016.

TECHNICAL FIELD

The present invention relates to an organic EL element production method, and an organic EL element.

BACKGROUND ART

A method described in Patent Literature 1 is known as a production method for producing an organic electroluminescent (EL) element. In a method described in Patent Literature 1, a laminate is formed, the laminate being formed of a substrate, a transparent electrode (first electrode section) provided on the substrate, an organic compound layer provided on the transparent electrode, and a metal-based electrode (second electrode section) arranged on the organic compound layer. Subsequently, an organic EL element is produced by microprocessing the metal-based electrode with a predetermined pattern. In the method of Patent Literature 1, when the metal-based electrode is microprocessed, the organic compound layer is also removed together.

CITATION LIST

Patent Literature

Patent Literature 1: Japanese Unexamined Patent Publication No. 2004-140003

SUMMARY OF INVENTION

Technical Problem

However, in the method described in Patent Literature 1, since the metal-based electrode (the second electrode section) must be microprocessed with the predetermined pattern, the productivity of the organic EL element decreases.

Accordingly, the present invention provides a production method for producing an organic EL element that enables the productivity to be improved, and provides the organic EL element.

Solution to Problem

A production method for producing an organic EL element according to one aspect of the present invention is a production method for producing an organic EL element including a first electrode section, an organic EL section provided on the first electrode section and including a light-emitting layer, and a second electrode section provided on the organic EL section and configured to supply electric power to the organic EL section in conjunction with the first electrode section. The production method includes an organic EL section forming step of forming the organic EL section on an organic EL section arrangement area that is a part of the first electrode section, while an electrode-attached substrate having a main surface on which the first electrode section is provided is conveyed in a first direction, a conductive film forming step of forming a band-shaped conductive film on the main surface of the substrate along the first direction so as to cover the organic EL section and at least a part of an external connection area arranged so as to come in contact with the organic EL section arrangement area in the first electrode section in a second direction that is substantially orthogonal to the first direction, while the electrode-attached substrate subjected to the organic EL section forming step is conveyed in the first direction, and a separation step of removing the conductive film in a predetermined area in the second direction to separate in an insulated manner the conductive film into a first part that is the second electrode section and a second part arranged on the external connection area, and to form a groove section extending in the first direction, while the electrode-attached substrate subjected to the conductive film forming step is conveyed in the first direction, wherein the predetermined area is set such that the groove section causes the first part and the external connection area to be insulated and separated from each other.

In the above-described method, after the organic EL section is formed on the electrode-attached substrate, a band-shaped conductive film is formed on the main surface of the substrate so as to cover the organic EL section and at least a part of the external connection area, along the first direction that is a conveying direction of the electrode-attached substrate. Subsequently, a groove section along the first direction is formed by removing the conductive film in the predetermined area. This groove section causes the conductive film to be separated into the first part that is the second electrode section, and the second part, and causes the first part to be insulated from the external connection area. In other words, in the above-described method, the predetermined area of the band-shaped conductive film formed along the first direction that is the conveying direction of the electrode-attached substrate is removed along the first direction to form the second electrode section. Thus, a direction in which the groove section is formed is the conveying direction of the electrode-attached substrate, and therefore the groove section can be formed while the electrode-attached substrate is conveyed. As the result, the second electrode section is formed while the electrode-attached substrate is conveyed. In this case, patterning of the conductive film is not required in the second direction that is substantially orthogonal to the first direction. Accordingly, the second electrode section can be easily formed. As the result, in the above-described method, the productivity of the organic EL element can be improved.

One end of the predetermined area on the organic EL section arrangement area side in the second direction may be located on a boundary between the organic EL section arrangement area and the external connection area. This enables only the conductive film to be substantially removed. A part removed to form the groove section becomes foreign matter from a standpoint of the organic EL element. If the conductive film and the organic EL section are removed together, the foreign matter tends to increase. However, as described above, if substantially only the conductive film is removed, the foreign matter can be made decreased. Therefore, the degradation in quality of the organic EL element caused by the foreign matter can be suppressed.

The production method may further include an insulation section forming step of forming an insulation section on the external connection area such that a side surface is located on boundary between the organic EL section arrangement area and the external connection area in the first electrode section, wherein, in the conductive film forming step, the conductive film is formed on the main surface along the first direction so as to cover the organic EL section, the insulation section and at least a part of the external connection area, while the electrode-attached substrate on which the insulation section and the organic EL section are formed is conveyed in the first direction, and the predetermined area is located on the insulation section.

If the insulation section is formed as described above, when the conductive film is formed, the insulation section insulates the conductive film from an area in which the insulation section is formed in the external connection area. Accordingly, if the above-described predetermined area is set on an area in which the insulation section is formed in the second direction, the first part and the external connection area can be insulated from each other. Therefore, providing the insulation section enables easy position adjustment of the predetermined area.

In the separation step, the groove section may be formed by irradiating the conductive film with a laser beam.

The production method for producing an organic EL element according to one embodiment may further include a bonding step of bonding a band-shaped sealing member to the electrode-attached substrate along the first direction so as to seal an area exposed due to the groove section in the organic EL section, while the electrode-attached substrate subjected to the separation step is conveyed in the first direction.

In this case, even if the groove section is formed in the separation step, the area exposed due to the groove section in the organic EL section is sealed with the sealing member, and therefore the deterioration of the organic EL section can be suppressed.

The production method for producing an organic EL element according to one embodiment may further include a moisture absorbing section forming step of forming an insulative moisture absorbing section in the groove section so as to cover an area exposed due to the groove section in the organic EL section.

In this case, even if the groove section is formed in the separation step, the area exposed due to the groove section in the organic EL section is covered by the moisture absorbing section, and therefore the deterioration of the organic EL section can be suppressed.

In the moisture absorbing section forming step, the moisture absorbing section may be formed so as to further cover a side surface that forms the groove section in the second electrode section.

In this case, even when the produced organic EL element is bent, the side surface formed with the groove section in the second electrode section is covered with the insulative moisture absorbing section, and therefore the second electrode section (the first part) is prevented from coming in contact with the second part.

The production method for producing an organic EL element according to one embodiment may further include a bonding step of bonding a band-shaped sealing member to the electrode-attached substrate along the first direction so as to seal an area exposed due to the groove section in the organic EL section, while the electrode-attached substrate subjected to the moisture absorbing section forming step is conveyed in the first direction.

In this case, the area exposed due to the groove section in the organic EL section is sealed with the sealing member, and therefore the deterioration of the organic EL section can be further suppressed.

An organic EL element according to another aspect of the present invention includes a substrate, a first electrode section provided on a main surface of the substrate, an organic EL section provided on the first electrode section and including a light-emitting layer, and a second electrode section provided on the organic EL section and configured to supply electric power to the organic EL section in conjunction with the first electrode section, wherein the first electrode section includes an organic EL section arrangement area on which the organic EL section is arranged, and an external connection area being in contact with the organic EL section arrangement area in a predetermined direction and for externally connecting the organic EL section arrangement area, and wherein an conductive member is provided on the external connection area, arranged apart from the second electrode section in the predetermined direction, and formed of the same material as a material of the second electrode section, is.

The above-described organic EL element can be preferably produced by the production method for producing an organic EL element according to one aspect of the present invention described above on the assumption that, for example, the predetermined direction is the second direction in the production method for producing an organic EL element according to one aspect of the present invention, and a direction that is substantially orthogonal to the predetermined direction is the first direction. Therefore, the above-described organic EL element can have a configuration capable of improving the productivity.

The above-described organic EL element may further include an insulation section provided on the external connection area and having a side surface at a position of a boundary between the organic EL section arrangement area and the external connection area, wherein a clearance between the conductive member and the second electrode section is located above the insulation section. The above-described organic EL element can be preferably produced by, for example, a production method for producing an organic EL element, the production method being provided with the insulation section forming step. In this case, it is easy to align a position of the predetermined area in the production method for producing an organic EL element, and therefore the organic EL element having the above-described configuration can achieve further improvement in productivity.

The organic EL element according to one embodiment may further include an insulative moisture absorbing section provided between the second electrode section and the conductive member and configured to cover an area of a clearance between the second electrode section and the conductive member in the organic EL section.

In this case, an area of a clearance between the second electrode section and the conductive member in the organic EL section is covered with the moisture absorbing section, and therefore the deterioration of the organic EL section can be suppressed.

The moisture absorbing section may further cover a side surface of the second electrode section on the conductive member side.

In this case, even when the organic EL element is bent, the side surface of the second electrode section on the conductive member side is covered with the insulative moisture absorbing section, and therefore it is possible to prevent the second electrode section and the conductive member from coming in contact with each other.

The organic EL element according to one embodiment may further include a sealing member provided on the second electrode section and configured to seal an area of a clearance between the second electrode section and the conductive member in the organic EL section. In this case, the area of the clearance between the second electrode section and the conductive member in the organic EL section is sealed with the sealing member, and therefore the deterioration of the organic EL section can be suppressed.

Advantageous Effects of Invention

According to the present invention, an organic EL element that enables the productivity to be improved, and a production method for producing the organic EL element, are provided.

DESCRIPTION OF EMBODIMENTS

Figure 1:
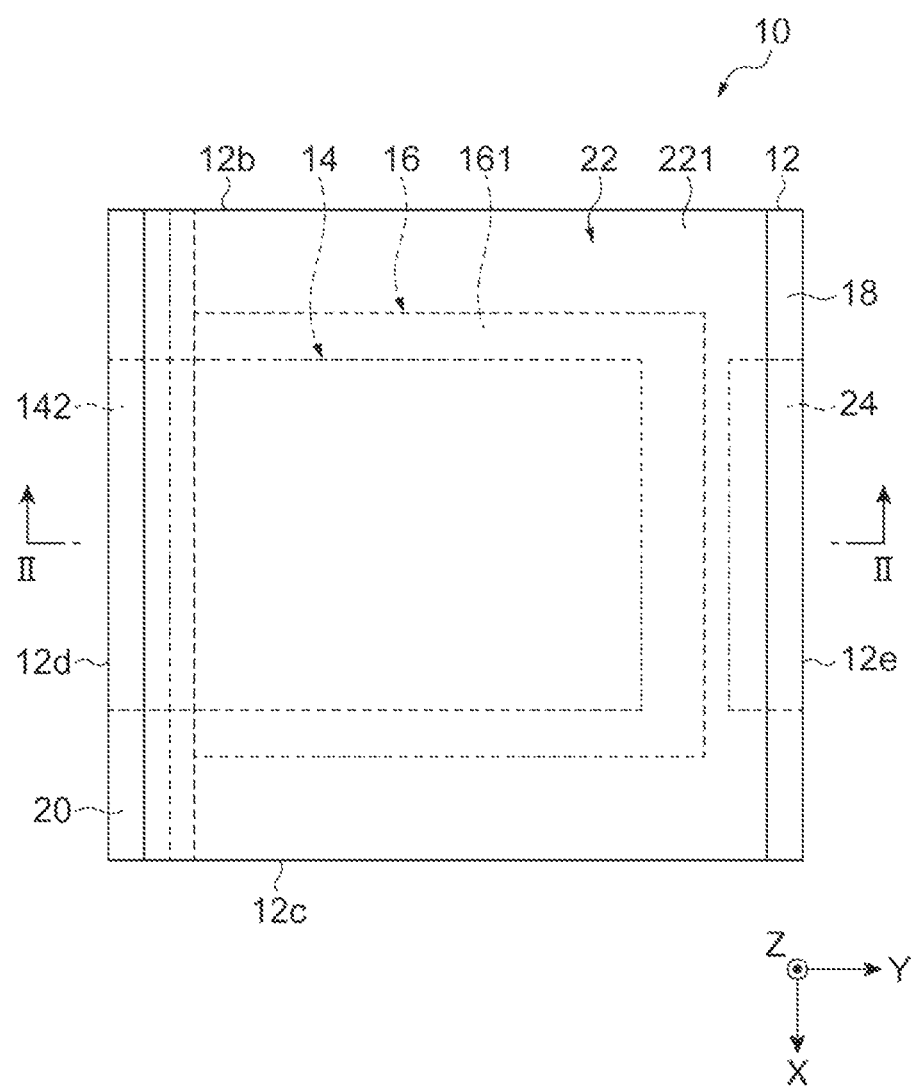
FIG. 1 is a plan view illustrating an organic EL element according to a first embodiment.

Preferred embodiments of the present invention will be detailed below with reference to the accompanying drawings. In the explanation of the drawings, identical elements are denoted by identical reference numerals, and overlapping explanation will be omitted. Size ratios in the drawings do not always agree with those explained.

First Embodiment

Figure 2:
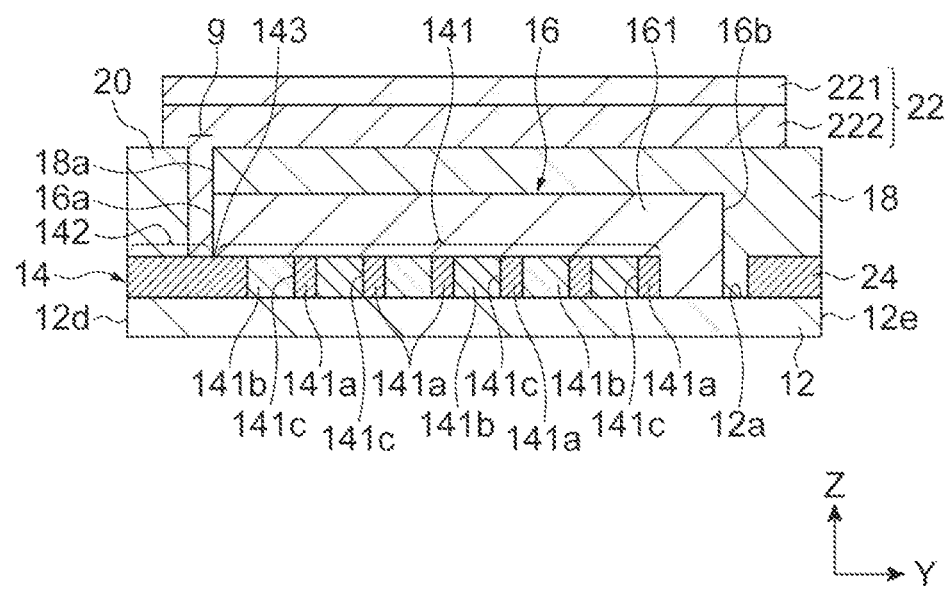
FIG. 2 is a cross-sectional view along an II-II line of FIG. 1.

As schematically illustrated in FIGS. 1 and 2, an organic EL element 10 according to the first embodiment includes a support substrate 12, an anode (a first electrode section) 14, an organic EL section 16, a cathode (a second electrode section) 18, an conductive member 20, and a sealing member 22. In one embodiment, the organic EL element 10 may include an extraction electrode 24. Unless otherwise specified below, a configuration having the extraction electrode 24 will be described.

For the sake of convenience of explanation, as shown in FIGS. 1 and 2, a thickness direction of the support substrate 12 may be called a Z-axis direction, and a direction orthogonal to the Z-axis direction may be called an X-axis direction (a first direction) and a Y-axis direction (a second direction). The X-axis direction and the Y-axis direction are orthogonal to each other. In a production method for producing the organic EL element 10 described later, the X-axis direction corresponds to a conveying direction in which the support substrate 12 is conveyed, and the Y-axis direction corresponds to a width direction of the support substrate 12.

[Support Substrate]

The support substrate 12 is configured from a resin having translucency with respect to visible light (light having a wavelength of 400 nm to 800 nm). The support substrate 12 can be a film-like substrate. In the first embodiment, the support substrate 12 has flexibility. A thickness of the support substrate 12 is, for example, 30 μm to 500 μm.

The support substrate 12 is, for example, a plastic film. Examples of a material of the support substrate 12 can include, for example, polyether sulfone (PES); polyester resin such as polyethylene terephthalate (PET) and polyethylene naphthalate (PEN); polyolefin resin such as polyethylene (PE), polypropylene (PP), and cyclic polyolefin; polyamide resin; polycarbonate resin; polystyrene resin; polyvinyl alcohol resin; a saponified product of an ethylene-vinyl acetate copolymer; polyacrylonitrile resin; acetal resin; polyimide resin; and epoxy resin.

As a material of the support substrate 12, polyester resin, polyolefin resin are preferable among the above-described resins because of high heat resistance, low linear expansion coefficient, and low production cost. Polyethylene terephthalate, polyethylene naphthalate are in particular preferable. One kind of these resins may be independently used, or two or more kinds of these resins may be used in combination.

A barrier film may be arranged on a main surface 12a of the support substrate 12. The barrier film can be, for example, a film formed of silicon, oxygen, and carbon, or a film formed of silicon, oxygen, carbon, and nitrogen. Specifically, an example of a material of the barrier film is silicon oxide, silicon nitride, silicon oxynitride, or the like. An example of a thickness of the barrier film is 100 nm to 10 μm.

In the first embodiment, the support substrate 12 has a quadrangular shape such as a rectangle or a square. Therefore, the support substrate 12 has four side surfaces 12b, 12c, 12d, and 12e. The side surface 12c is located opposite to the side surface 12b in the X-axis direction, and the side surface 12e is located opposite to the side surface 12d in the Y-axis direction.

[Anode]

The anode 14 is provided on the main surface 12a of the support substrate 12. An electrode having optical transparency is used as the anode 14. A thin film having high electric conductivity, such as metallic oxide, metallic sulfide, and metal, can be used as the electrode having optical transparency, and a thin film having high light transmittance is preferably used. For example, a thin film made of indium oxide, zinc oxide, tin oxide, indium tin oxide (Indium Tin Oxide: abbreviated name is ITO), indium zinc oxide (Indium Zinc Oxide: abbreviated name is IZO), gold, platinum, silver, copper, and the like is used. Among them, a thin film made of ITO, IZO, or tin oxide is preferably used. A transparent conductive film made of an organic matter such as polyaniline and a derivative thereof, and polythiophene and a derivative thereof may be used as the anode 14.

The thickness of the anode 14 can be determined in consideration of optical transparency, electric conductivity, and the like. The thickness of the anode 14 is usually 10 nm to 10 μm, preferably 20 nm to 1 μm, and more preferably 50 nm to 500 nm.

The anode 14 includes an anode body part (an organic EL section arrangement area) 141 on which the organic EL section 16 is provided, and an external connection part (an external connection area) 142. In the first embodiment, the external connection part 142 is arranged so as to come in contact with the anode body part 141 in the Y-axis direction. The external connection part 142 is located on the side surface 12d side of the support substrate 12 when viewed from the anode body part 141.

The anode body part 141 may have a thin-film shape as described above. However, the anode body part 141 may have, for example, a network structure formed of an electric conductor. In a case where the anode body part 141 has a network structure, the anode body part 141 includes metal wiring 141a, and filling materials 141b as illustrated in FIG. 2. The metal wiring 141a is an electric conductor, and constitutes the network structure. A material of the metal wiring 141a is selected from among, for example, silver, aluminum, copper, palladium, gold, nickel, iron, molybdenum, and chrome, or is selected from among alloys (for example, MAM (Molybdenum Aluminum Molybdenum)) each including one or more kinds of these metals.

The metal wiring 141a is formed with a predetermined pattern that defines a plurality of blocks 141c. In a case where the metal wiring 141a is regarded as one layer, each of the blocks 141c corresponds to an opening (or a window part). The predetermined pattern is, for example, a lattice-shaped pattern. In the case of the lattice-shaped pattern, the plurality of blocks 141c corresponds to meshes. A shape of the mesh includes, for example, a quadrangle such as a rectangle or a square, a triangle, and a hexagon. A shape of the predetermined pattern is not limited so long as the metal wiring 141a has a network structure.

The filling materials 141b fill the respective blocks 141c. Thicknesses of the filling materials 141b are the same as those of the metal wiring 141a so as to planarize the anode body part 141. The filling materials 141b may be thicker than the metal wiring 141a, and be provided on the main surface 12a in such a manner as to bury the metal wiring 141a. As a material of the filling materials 141b, an organic matter, such as polyaniline and a derivative thereof, and polythiophene and a derivative thereof, can be exemplified. In this case, the filling materials 141b have high conductivity. However, the filling material 141b does not need to have conductivity.

The external connection part 142 functions as an area in which a connection terminal outside the organic EL element 10 is connected to the anode 14. As described above, in a case where the anode body part 141 has a network structure of the metal wiring 141a, the external connection part 142 can be configured from the same material as that of the metal wiring 141a.

[Extraction Electrode]

The extraction electrode 24 is arranged with a predetermined space provided with respect to the anode 14. In a mode shown in FIGS. 1 and 2, the extraction electrode 24 is arranged on the side surface 12e side of the support substrate 12 in the Y-axis direction. The extraction electrode 24 is electrically connected to the cathode 18, and functions as an area for electrically connecting the cathode 18 to a connection terminal outside the organic EL element 10 so as to apply electric power (for example, a voltage) to the cathode 18. A thickness of the extraction electrode 24 can be similar to that of the anode 14. A material of the extraction electrode 24 can be similar to that of the anode 14.

[Organic EL Section]

The organic EL section 16 includes a light-emitting layer 161, and is a functional part that contributes to light emission of the organic EL element 10, such as movement of carriers and recombination of carriers, according to electric power (for example, a voltage) applied to the anode 14 and the cathode 18. In the example shown in FIGS. 1 and 2, the organic EL section 16 has a single layer structure, and is configured from the light-emitting layer 161.

The light-emitting layer 161 is an organic layer provided on the anode 14. Usually, the light-emitting layer 161 is formed of an organic matter that mainly emits fluorescence and/or phosphorescence, or is formed of the organic matter and dopant that assists the organic matter. The dopant is added, for example, for improving luminous efficiency or changing emission wavelength. The organic matter included in the light-emitting layer 161 may be a low-molecular compound or a high-molecular compound. Examples of a light-emitting material included in the light-emitting layer 161 can include known materials. Specifically, examples of the above-described organic matter included in the light-emitting layer 161 can include known dye-based materials, metal complex-based materials, polymer-based materials, and the like. In a case where the light-emitting layer 161 includes a dopant, examples of a dopant material include known dopant materials.

A thickness of the light-emitting layer 161 is usually 2 nm to 200 nm. The light-emitting layer 161 is formed by, for example, a coating method that uses coating liquid containing the above-described light-emitting material. A solvent of the coating liquid containing the light-emitting material is not limited so long as the solvent dissolves the light-emitting material. Although an example of the coating method is an inkjet printing method, other known coating methods may be employed.

The organic EL section 16 is provided on the anode body part 141 in the anode 14. In the first embodiment, the organic EL section 16 covers the anode body part 141. This prevents a short circuit between the anode body part 141 and other electrodes (for example, the cathode 18 and the extraction electrode 24). The organic EL section 16 covers the anode body part 141 in the anode 14, and consequently a part of the organic EL section 16 is also arranged on the main surface 12a of the support substrate 12.

In the first embodiment, in the anode 14, an area in which the organic EL section 16 is arranged is referred to as the anode body part 141. Therefore, the side surface 16a of the organic EL section 16 is located on a boundary 143 between the anode body part 141 and the external connection part 142 in the Y-axis direction.

In FIGS. 1 and 2, a mode in which the organic EL section 16 is the light-emitting layer 161 is illustrated. However, the organic EL section 16 may be a laminate that includes the light-emitting layer 161 and other organic layers. In a case where the organic EL section 16 is a laminate, a thickness of the organic EL section 16 is, for example, 2 nm to 500 nm although the thickness depends on a layer configuration thereof. An example of a layer configuration in a case where the organic EL section 16 is a laminate will be described.

Examples of the functional layer provided between the anode 14 and the light-emitting layer 161 include a hole injection layer and a hole transport layer. Examples of the layer provided between the cathode 18 and the light-emitting layer 161 include an electron injection layer and an electron transport layer. Known materials can be used as a material of each of the hole injection layer, the hole transport layer, the electron transport layer and the electron injection layer. Thicknesses of the hole injection layer, the hole transport layer, the electron transport layer and the electron injection layer can be set as appropriate according to element performance or the like of the organic EL element 10.

The hole injection layer is a layer having a function of improving efficiency in hole injection from the anode 14 to the light-emitting layer 161. The hole transport layer is a layer having a function of improving hole injection from a hole transport layer that is closer to the anode 14, the hole injection layer or the anode 14 to the light-emitting layer 161. In a case where the hole injection layer and/or the hole transport layer have a function of blocking the transportation of electrons, these layers may be referred to as electron blocking layers.

The electron injection layer is a layer having a function of improving efficiency in electron injection from the cathode 18 to the light-emitting layer 161. The electron injection layer may configure a part of the cathode 18. The electron transport layer is a layer having a function of improving electron injection from an electron transport layer closer to the cathode 18, the electron injection layer, or the cathode 18. In a case where the electron injection layer and/or the electron transport layer have a function of blocking the transportation of a hole, these layers may be referred to as hole blocking layers.

Examples of a layer configuration of the organic EL element 10 including the above-described various kinds of functional layers, will be described below.

(a) Anode/light-emitting layer/cathode
(b) Anode/hole injection layer/light-emitting layer/cathode
(c) Anode/hole injection layer/light-emitting layer/electron injection layer/cathode
(d) Anode/hole injection layer/light-emitting layer/electron transport layer/electron injection layer/cathode
(e) Anode/hole injection layer/hole transport layer/light-emitting layer/cathode
(f) Anode/hole injection layer/hole transport layer/light-emitting layer/electron injection layer/cathode
(g) Anode/hole injection layer/hole transport layer/light-emitting layer/electron transport layer/electron injection layer/cathode
(h) Anode/light-emitting layer/electron injection layer/cathode
(i) Anode/light-emitting layer/electron transport layer/electron injection layer/cathode A symbol "/" means that layers on both sides of the symbol "/" are joined to each other.

The organic EL element 10 may include a single light-emitting layer 161 or may include two or more light-emitting layers 161. When a layered structure arranged between the anode 14 and the cathode 18 is defined as a "structural unit A" in any one of the above-described layer configurations (a) to (i), it is possible to exemplify a layer configuration illustrated in the following (j) as a configuration of the organic EL element 10 including two light-emitting layers 161. The layer configurations of the two (structural unit A) may be the same as each other, or may differ from each other.

(j) Anode/(structural unit A)/charge generation layer/(structural unit A)/cathode Here, the charge generation layer is a layer that generates holes and electrons by applying an electric field. An example of the charge generation layer is a thin film formed of vanadium oxide, ITO, molybdenum oxide, or the like.

With "(structural unit A)/charge generation layer" is defined as "structural unit B", it is possible to exemplify a layer configuration illustrated in the following (k) as a configuration of the organic EL element 10 including three or more-layered light-emitting layers 161.

(k) Anode/(structural unit B)x/(structural unit A)/cathode

Symbol "x" represents an integer of two or more, and "(structural unit B)x" represents a laminate in which (structural unit B) is laminated by x stages. In addition, the layer configuration of a plurality of (structural unit B) may be the same as one another, or may differ from one another.

The organic EL element 10 may be configured by directly laminating the plurality of light-emitting layers 161 without providing a charge generation layer.

[Cathode]

The cathode 18 is provided on the organic EL section 16, and has a function of supplying electric power to the organic EL section 16 in conjunction with the anode 14 (specifically, in conjunction with the anode body part 141). As shown in FIG. 1, the cathode 18 is provided from the side surface 12b to the side surface 12c of the support substrate 12 in the X-axis direction, and as shown in FIG. 2, the cathode 18 is provided from the side surface 12e of the support substrate 12 to a position of the side surface 16a in the organic EL section 16 in the Y-axis direction. Therefore, as shown in FIG. 2, the cathode 18 is provided not only on the main surface 12a between the extraction electrode 24 and the anode 14, but also on the extraction electrode 24. As the result, the cathode 18 is electrically connected to the extraction electrode 24.

In FIG. 2, the side surface 18a of the cathode 18 is flush with the side surface 16a of the organic EL section 16. However, the side surface 18a of the cathode 18 may be located inside of the periphery of the organic EL section 16 (the side surface 16b side opposite to the side surface 16a of the organic EL section 16). An example of a material of the cathode 18 will be described later.

A thickness of the cathode 18 is set in consideration of electric conductivity, durability or the like. The thickness of the cathode 18 is usually 10 nm to 10 μm, preferably 20 nm to 1 μm, and more preferably 50 nm to 500 nm.

[Conductive Member]

The conductive member 20 is provided on the external connection part 142. As shown in FIG. 1, the conductive member 20 is provided between the side surface 12b and the side surface 12c of the support substrate 12 in the X-axis direction. Therefore, the conductive member 20 can be a conductive thin plate (or a conductive wall) set up on the external connection part 142, and extends in the X-axis direction. The conductive member 20 is provided on the external connection part 142, and therefore the conductive member 20 is also capable of functioning as an external connection part. As shown in FIG. 2, the conductive member 20 is arranged so as to be spaced away from the cathode 18 in the Y-axis direction. In other words, in the Y-axis direction, a clearance g is provided between the conductive member 20 and the cathode 18. The material of the conductive member 20 is the same as that of the cathode 18, and the height of the conductive member 20 from the main surface 12a of the support substrate 12 is the same as that of the cathode 18.

[Sealing Member]

The sealing member 22 is a member for sealing at least the organic EL section 16. The sealing member 22 is provided on the main surface 12a of the support substrate 12 between the side surface 12b and the side surface 12c of the support substrate 12. Specifically, the sealing member 22 is provided not only on the cathode 18 and the conductive member 20 but also on the main surface 12a in the clearance g between the cathode 18 and the conductive member 20. The Y-axis direction width of the sealing member 22 is narrower than the width of the support substrate 12. In a case where the organic EL element 10 is viewed from the thickness direction thereof, the cathode 18 and the conductive member 20 are partially exposed from the sealing member 22. In the cathode 18 and in the conductive member 20, an area that is not covered with the sealing member 22 can be used to electrically connect the cathode 18 and the conductive member 20 to an external device or a circuit. The sealing member 22 includes a sealing base material 221, and an adhesive part 222.

The sealing base material 221 is arranged on the opposite side of the support substrate 12 in the organic EL element 10. The sealing base material 221 is formed of metal foil, a barrier film including a transparent plastic film of which the front face, the rear face or both faces have a functional barrier layer, a thin film glass having flexibility, a plastic film on which a metal having barrier properties is laminated, or the like. The sealing base material 221 has a gas barrier function, and in particular a water barrier function. Copper foil, aluminum foil, and stainless steel foil are preferable as metal foil from the viewpoint of barrier properties. As the thickness of the metal foil, thicker metal foil is preferable from the viewpoint of pin-hole suppression. However, when flexibility is also taken into consideration, a thickness of 15 μm to 50 μm is preferable.

The adhesive part 222 is provided on the surface of the sealing base material 221 on the support substrate 12 side, and is used to bond the sealing base material 221 to the support substrate 12 on which the anode 14, the organic EL section 16 and the cathode 18 are formed. The cathode 18 and the conductive member 20 are arranged by being spaced away from each other in the Y-axis direction, and therefore the clearance g therebetween is also filled with the adhesive part 222. Consequently, the side surface 16a of the organic EL section 16 on the conductive member 20 side is covered with the adhesive part 222. As the result, the side surface 16a is prevented from being exposed to the outside.

Specifically, the adhesive part 222 is configured from a photocurable or thermosetting acrylate resin, or a photocurable or thermosetting epoxy resin. Besides the above, a resin film that can be fusion-bonded by a commonly used impulse sealer, for example, a thermal bonding film such as an ethylene-vinyl acetate copolymer (EVA), a polypropylene film, a polyethylene film, and polybutadiene film can be used. A thermoplastic resin can also be used as a material of the adhesive part 222.

Among peripheral surfaces of the cathode 18 in the organic EL element 10 according to the first embodiment, an area other than the side surface 18a on the conductive member 20 side is not covered with the sealing member 22, and thus is exposed. Accordingly, a material that is not substantially influenced by water is preferable as a material of the cathode 18. From this point of view, examples of the material for the cathode 18 include transition metal oxide, aluminum, and silver. The cathode 18 may be configured from one metal, or may be configured from alloy of the exemplified metal. Moreover, the cathode 18 may have a multilayer structure.

Figure 3:
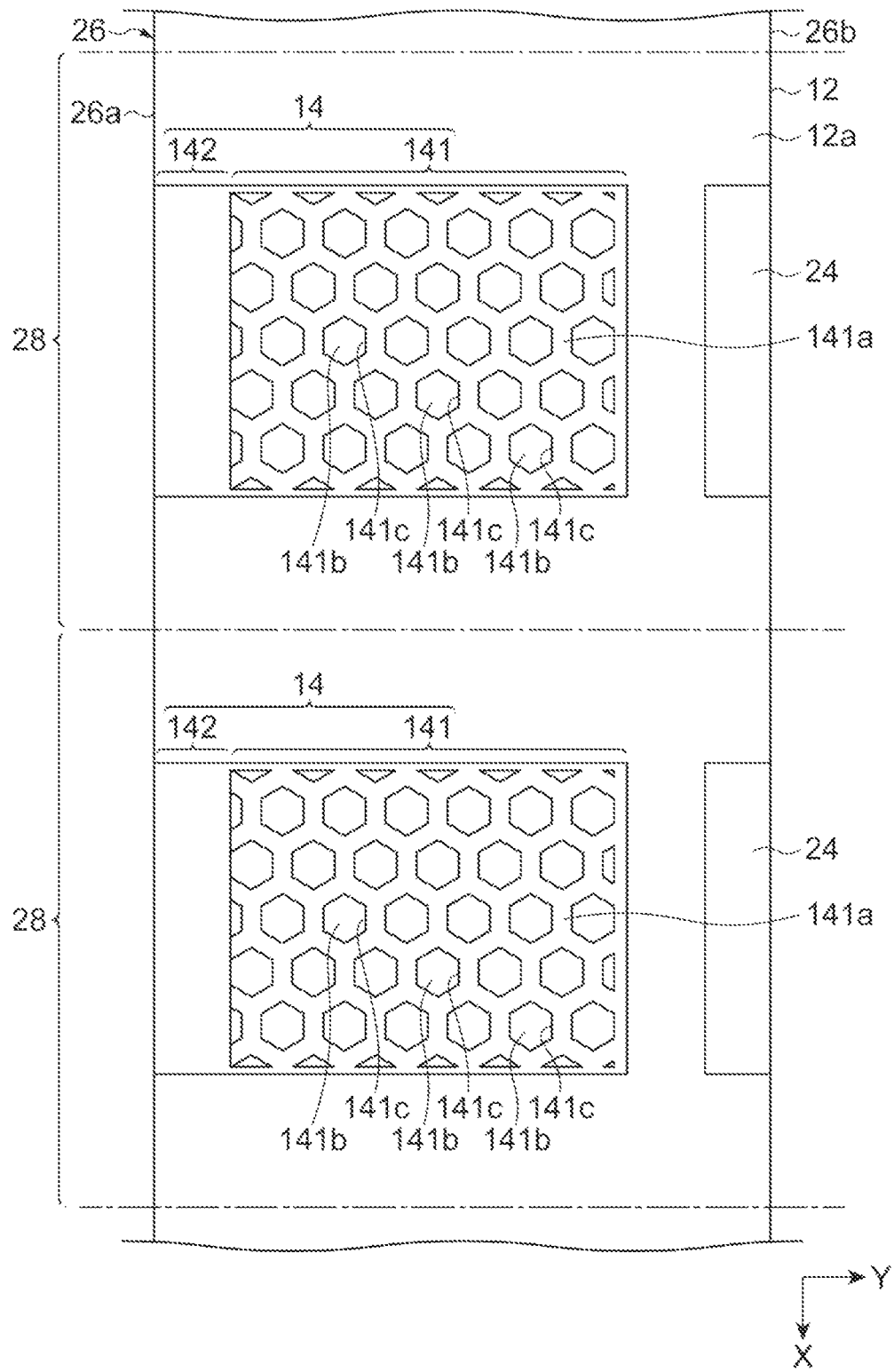
FIG. 3 is a top view illustrating a long-length electrode-attached substrate used in a production method for producing an organic EL element according to the first embodiment.

Next, a production method for producing the organic EL element 10 will be described with reference to FIGS. 3 to 10. Here, as shown in FIG. 3, a case will be described where the organic EL element 10 is produced by using a long-length electrode-attached substrate 26 including a long-length support substrate 12 having flexibility, a plurality of anodes 14 being discretely provided in the longitudinal direction, and a plurality of extraction electrodes 24. A case where the organic EL element 10 is produced by using a roll-to-roll method will be described.

A plurality of organic EL element formation areas 28 are virtually set on the main surface 12a of the long-length support substrate 12, and each of the organic EL element formation areas 28 is provided with one anode 14 and one extraction electrode 24. In the organic EL element formation area 28, the extraction electrode 24 corresponding to the anode 14 is arranged with a predetermined space provided in a direction orthogonal to the longitudinal direction of the support substrate 12 (hereinafter also referred to as a "width direction"). The anode 14 may be formed so as to be spaced away from an edge part 26a of the electrode-attached substrate 26 by a constant distance, and the extraction electrode 24 may be formed so as to be spaced away from an edge part 26b of the electrode-attached substrate 26 by a constant distance.

A size of the organic EL element formation area 28 is set according to the size of the organic EL element 10 to be produced. In the first embodiment, the Y-axis direction length of the electrode-attached substrate 26 is the same as the Y-axis direction length (width) of the organic EL element formation area 28. However, the Y-axis direction length of the electrode-attached substrate 26 may be longer than the Y-axis direction length of the organic EL element formation area 28.

The anode 14 includes the anode body part 141 that is an organic EL section arrangement area in which the organic EL section 16 is arranged, and the external connection part 142 that is an external connection area. The external connection part 142 is arranged on the edge part 26a side of the electrode-attached substrate 26 in the width direction of the support substrate 12 when viewed from the anode body part 141.

As shown in FIG. 3, in a case where the anode body part 141 is configured from the metal wiring 141a having a network structure, and the filling material 141b that buries the block 141c defined by the metal wiring 141a, the anode 14 and the extraction electrode 24 are preferably formed by, for example, an inkjet printing method. Specifically, a conductive material to be the metal wiring is applied in a pattern corresponding to the external connection part 142, the metal wiring 141a and the extraction electrode 24, and the coated film is dried and solidified to form the external connection part 142, the metal wiring 141a and the extraction electrode 24. Subsequently, coating liquid containing a material to be the filling material 141b is filled in the block 141c defined by the metal wiring 141a, and is then dried and solidified. As the result, the anode 14 and the extraction electrode 24 can be formed. FIG. 3 shows a case where a shape of the block 141c defined by the metal wiring 141a is a hexagon. However, as described above, the shape of block 141c is not limited to the hexagon.

In a case where the anode 14 is formed of one sheet of conductive film, the anode 14 and the extraction electrode 24 may be formed by a coating method similar to the above, or may be formed by using maicroprocessing technology such as photolithography.

In a case where the organic EL element 10 is produced, there are provided: an organic EL section forming step S10 of forming the organic EL section 16; a conductive film forming step S12 of forming the conductive film 34; a separation step S14 of separating the conductive film 34 into the cathode 18 and the conductive member 20; a bonding step S16 of bonding the sealing member 22 to the support substrate 12 on which the cathode 18 and the conductive member 20 are formed; and a cutting step S18 of cutting out the organic EL element 10 from the electrode-attached substrate 26.

In the first embodiment, as conceptually shown in FIG. 4, the organic EL section forming step S10, the conductive film forming step S12, the separation step S14, and the bonding step S16 are performed by the roll-to-roll method while the long-length electrode-attached substrate 26 having flexibility, which is extended between an unwinding roll 30A and a winding roll 30B, is continuously conveyed by the conveying roller 32, and subsequently the cutting step S18 is performed. Each step will be described below in detail.

(Organic EL Section Forming Step)

Figure 5:
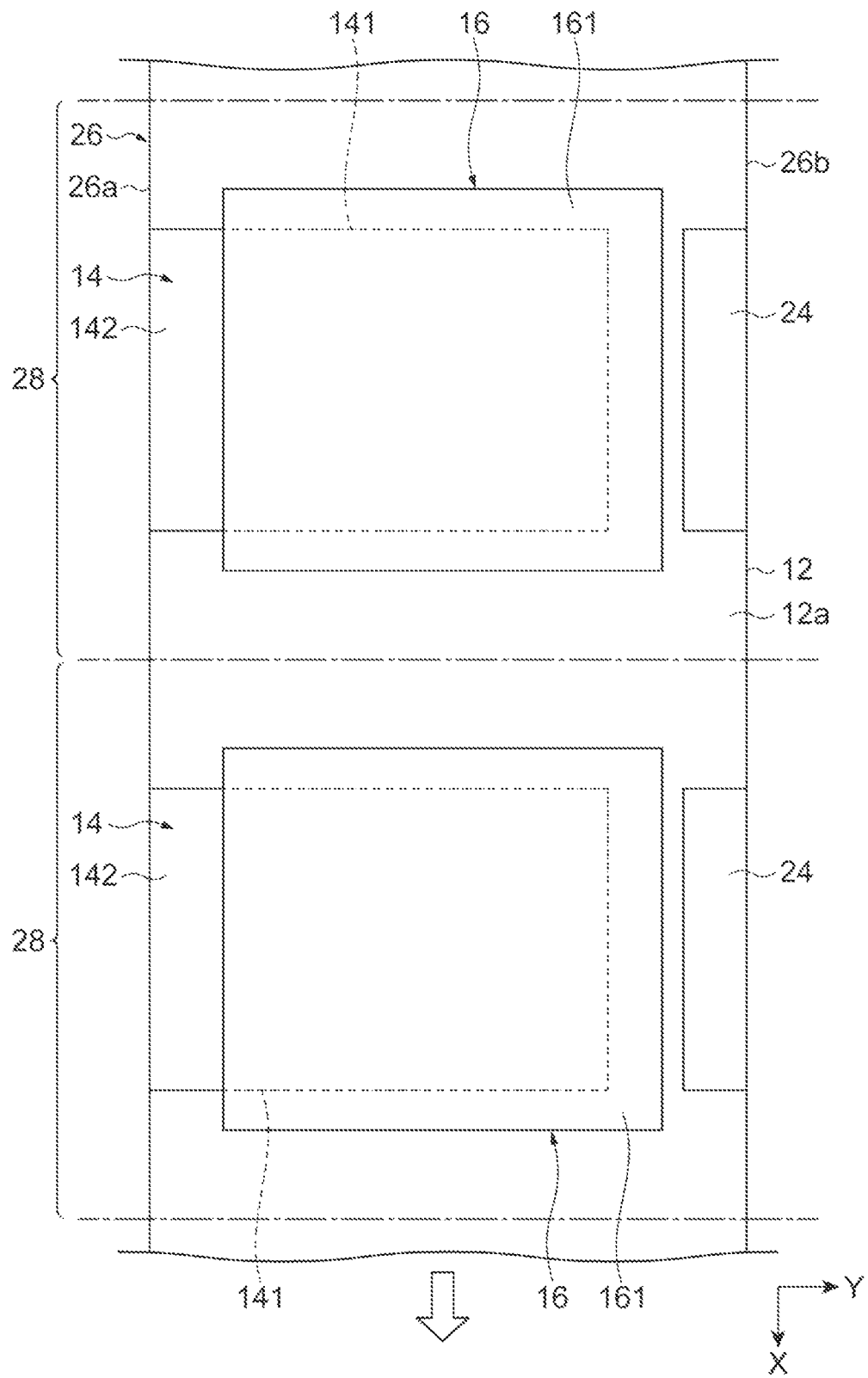
FIG. 5 is a drawing illustrating an organic EL section forming step.

In the organic EL section forming step S10, while the electrode-attached substrate 26 is conveyed in the longitudinal direction (X-axis direction) of the electrode-attached substrate 26 as indicated by a white arrow of FIG. 5, the organic EL section 16 is formed by, for example, the coating method so as to cover the anode body part 141 in the anode 14. In a case where the organic EL section 16 is the light-emitting layer 161, coating liquid containing a material to be the light-emitting layer 161 is coated on an area for forming the organic EL section 16, and is then dried, thereby forming the light-emitting layer 161 as the organic EL section 16. An example of the coating method is inkjet printing method.

In a mode in which the organic EL section 16 has a functional layer other than the light-emitting layer 161, each functional layer may be formed by a method similar to that of the above-described light-emitting layer 161 sequentially from the anode 14 side while the electrode-attached substrate 26 is conveyed. The formation method for forming the organic EL section 16 is not limited to the coating method so long as the organic EL section 16 can be formed.

(Conductive Film Forming Step)

Figure 6:
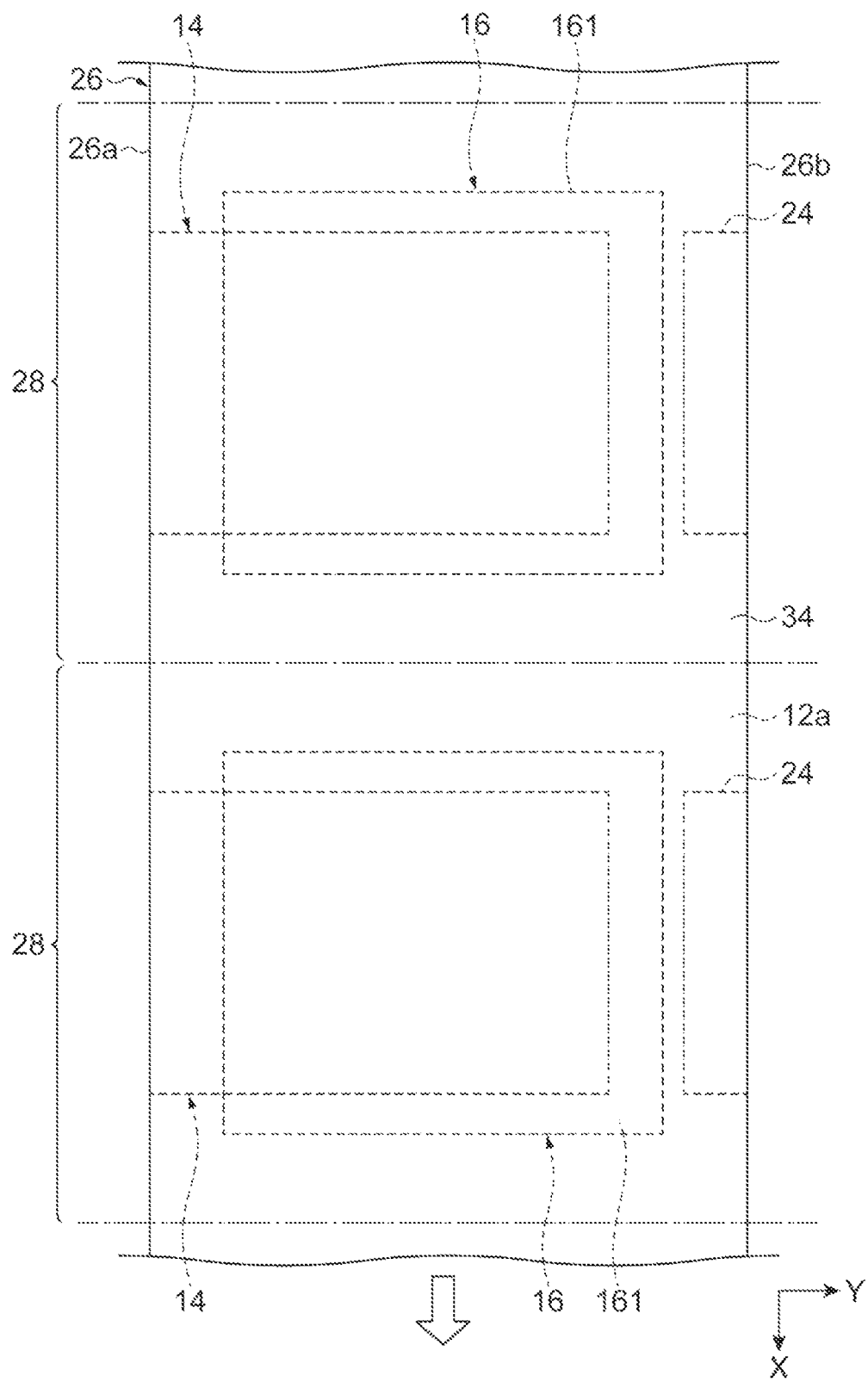
FIG. 6 is a drawing illustrating a conductive film forming step.

In the conductive film forming step S12, while the electrode-attached substrate 26 on which the organic EL section 16 is formed is conveyed in a longitudinal direction thereof, the conductive film 34 is formed on the electrode-attached substrate 26 as shown FIG. 6. The conductive film 34 is a film to be the cathode 18 and the conductive member 20.

The conductive film 34 is continuously formed over the plurality of organic EL element formation areas 28 along the longitudinal direction of the electrode-attached substrate 26. In other words, the conductive film 34 formed in the conductive film forming step S12 is the band-shaped conductive film 34 extending along a conveying direction. The conductive film 34 is formed on the whole main surface 12a of the support substrate 12. Therefore, the anode 14, the organic EL section 16 and the extraction electrode 24 are covered with the conductive film 34, and in the main surface 12a, an area other than the area in which the anode 14, the organic EL section 16 and the extraction electrode 24 are provided is also covered with the conductive film 34.

The conductive film 34 can be formed by, for example, a coating method. Specifically, coating liquid containing a cathode material is coated on the main surface 12a of the electrode-attached substrate 26 on which the organic EL section 16 is formed, thereby forming a coated film that covers the main surface 12a, and subsequently the coated film is dried and solidified to form the conductive film 34. As the coating method, a coating method similar to that used when the organic EL section 16 is formed can be exemplified. However, the conductive film 34 may be formed by a vacuum deposition method, a sputtering method, or a lamination method in which a metallic thin film is thermocompressed.

In a mode in which the cathode 18 has a layered structure, the conductive film corresponding to each layer to be the cathode 18 has only to be successively formed from a layer located on the organic EL section 16 side while the electrode-attached substrate 26 is conveyed in the longitudinal direction.

(Separation Step)

Figure 7:
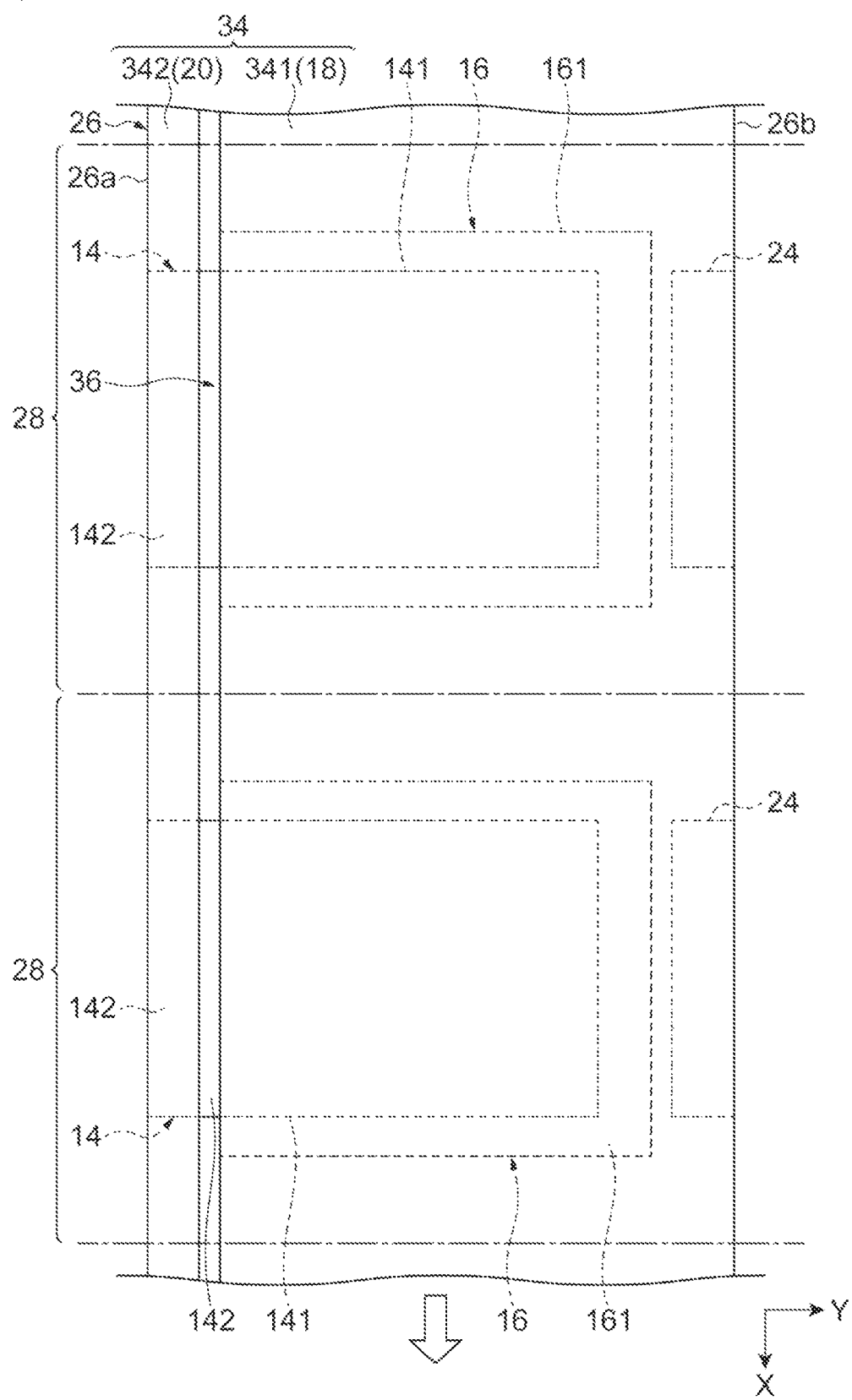
FIG. 7 is a drawing illustrating a separation step.

In the separation step, as shown in FIG. 7, the conductive film 34 is linearly removed along the conveying direction of the electrode-attached substrate 26 to form a groove section 36 extending in the conveying direction. Due to this groove section 36, the conductive film 34 is separated in an insulated manner into a first part 341 that is the cathode 18 and a second part 342 that is the conductive member 20.

An example of the separation step S14 will be described in detail by using FIG. 8. FIG. 8(a) is a drawing for explaining the separation step S14, and schematically illustrates a cross sectional configuration in a case where the electrode-attached substrate 26 provided with the conductive film 34 is cut by a plane orthogonal to a longitudinal direction thereof. FIG. 8(b) shows a cross section corresponding to FIG. 8(a) after the completion of the separation step S14.

Figure 8:
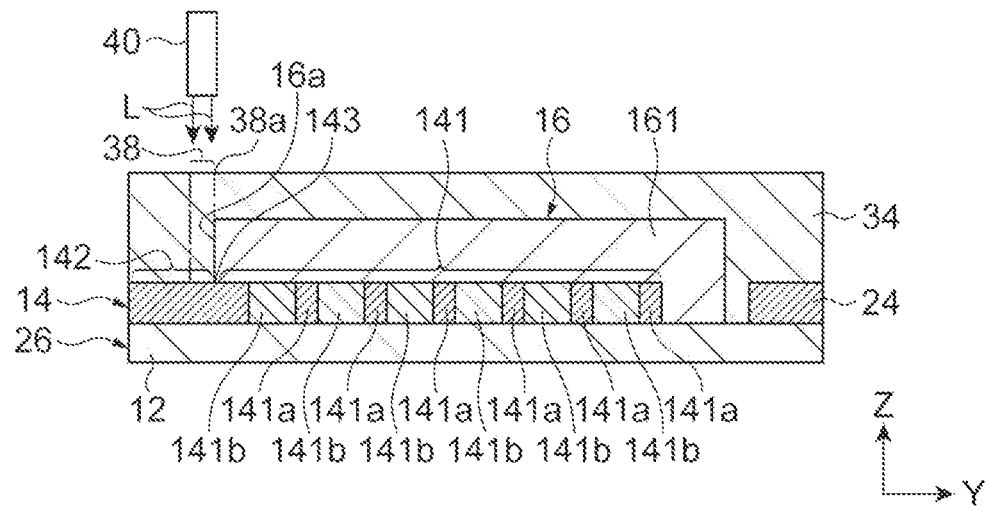
FIG. 8 is a drawing illustrating a separation step, FIG. 8(a) schematically illustrates a cross sectional configuration of an electrode-attached substrate after the formation of a conductive film in order to explain the separation step, and FIG. 8(b) schematically illustrates a cross sectional configuration of the electrode-attached substrate subjected to the separation step.
Figure 8:
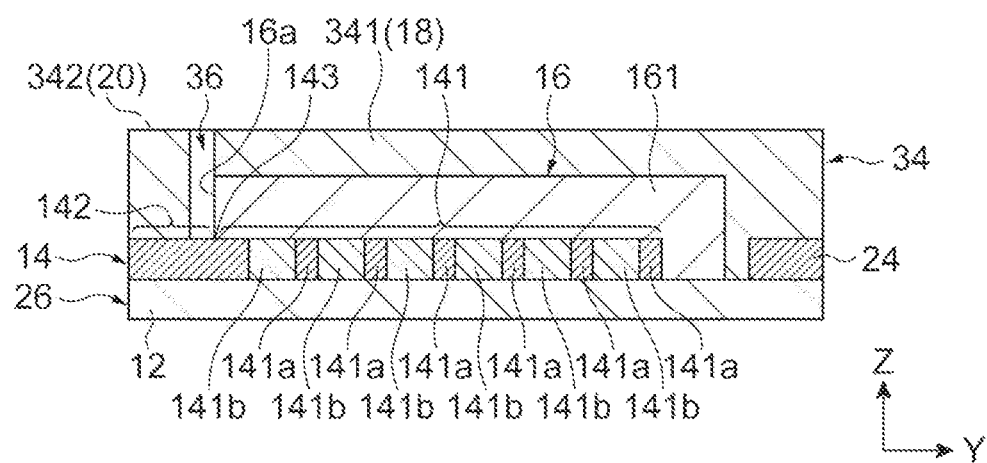

In the separation step S14, as shown in FIG. 8(a), a laser device 40 is arranged above the conductive film 34, and a predetermined area 38 of the conductive film 34 in the Y-axis direction is irradiated with a laser beam L to remove the conductive film 34 in the predetermined area 38. Consequently, as shown in FIG. 8(*b*), the predetermined area 38 is formed with the groove section 36 that penetrates the conductive film 34. The electrode-attached substrate 26 is conveyed in the longitudinal direction thereof, and therefore, by irradiating the predetermined area 38 of the conductive film 34 with the laser beam L from the laser device 40, the groove section 36 that extends along the longitudinal direction of the electrode-attached substrate 26 (refer to FIG. 7) is continuously formed.

The predetermined area 38 is a removal area in which the conductive film 34 is removed, and corresponds to an irradiated area of the laser beam L. The predetermined area 38 has only to be set in such a manner that the insulation between the first part 341 and the external connection part 142 can be ensured. In one embodiment, the predetermined area 38 is set in such a manner that an end 38*a* of the predetermined area 38 in the Y-axis direction is located on the boundary 143 between the anode body part 141 and the external connection part 142. It is enough that the width of the predetermined area 38 (in other words, the width of the groove section 36) is of a length that causes the groove section 36 to insulate and separate the first part 341 from the external connection part 142 and the conductive member 20. However, since the removed amount of the conductive film 34 decreases with the decrease in width, the narrower width is preferable from the viewpoint of the productivity and from the viewpoint of reducing debris.

For example, by pulse-driving the pulse laser device 40, the conductive film 34 can be subjected to pulse irradiation with the laser beam L. The pulse width and pulse intervals have only to be set in such a manner that the conductive film 34 can be removed. It is enough that a wavelength of the laser beam L is of a wavelength with which the conductive film 34 can be processed. In other words, it is enough that a wavelength of the laser beam L is of a wavelength of a wavelength range within which the laser beam L is absorbed by the conductive film 34. A wavelength that is hard to be absorbed by the organic EL section 16, and that is absorbed by the conductive film 34 in a larger amount, is preferable as the wavelength of the laser beam L. In other words, a wavelength with which the absorbed amount by the conductive film 34 is larger than the absorbed amount by the organic EL section 16 (specifically, the outermost surface layer of the organic EL section 16, or a layer in proximity thereof) is preferable as the wavelength of the laser beam L. As the result, even when a part of the organic EL section 16 is located in an irradiation position of the laser beam L, that is to say, in the predetermined area 38, due to a position adjustment error or the like, the organic EL section 16 is hardly removed, and substantially the conductive film 34 is selectively removed. Accordingly, while it is easy to align the irradiation position of the laser beam L, the removal by the laser beam L enables the amount of debris such as the scattered conductive film 34 to be reduced.

Here, the mode in which the laser beam L is used has been exemplified as a method for removing the conductive film 34. However, in the separation step S14, it is enough that the conductive film 34 in the predetermined area 38 in the Y-axis direction is linearly removed along the X-axis direction. For example, the conductive film 34 may be removed by sticking a tape on the conductive film 34 along the conveying direction of the electrode-attached substrate 26, and then by removing the tape. Alternatively, the conductive film 34 may be linearly removed by a cutting device provided with a cutting mechanism such as a cutting blade.

(Bonding Step)

In the bonding step S16, while the electrode-attached substrate 26 subjected to the separation step S14 is conveyed in the longitudinal direction, the band-shaped sealing member 22 is bonded on the main surface 12*a* of the electrode-attached substrate 26 over the plurality of organic EL element formation areas 28 from the cathode 18 side. Specifically, a position of the sealing member 22 is aligned with the electrode-attached substrate 26 so as to cover the groove section 36 while not covering a part of the cathode 18 that includes the first part 341 and a part of the conductive member 20 that includes the second part 342, and in this state, the adhesive part 222 of the sealing member 22 is pressed against the main surface 12*a* of the electrode-attached substrate 26, and the sealing member 22 and the electrode-attached substrate 26 are heated, thereby bonding the electrode-attached substrate 26 subjected to the separation step S14 to the sealing member 22.

Figure 9:
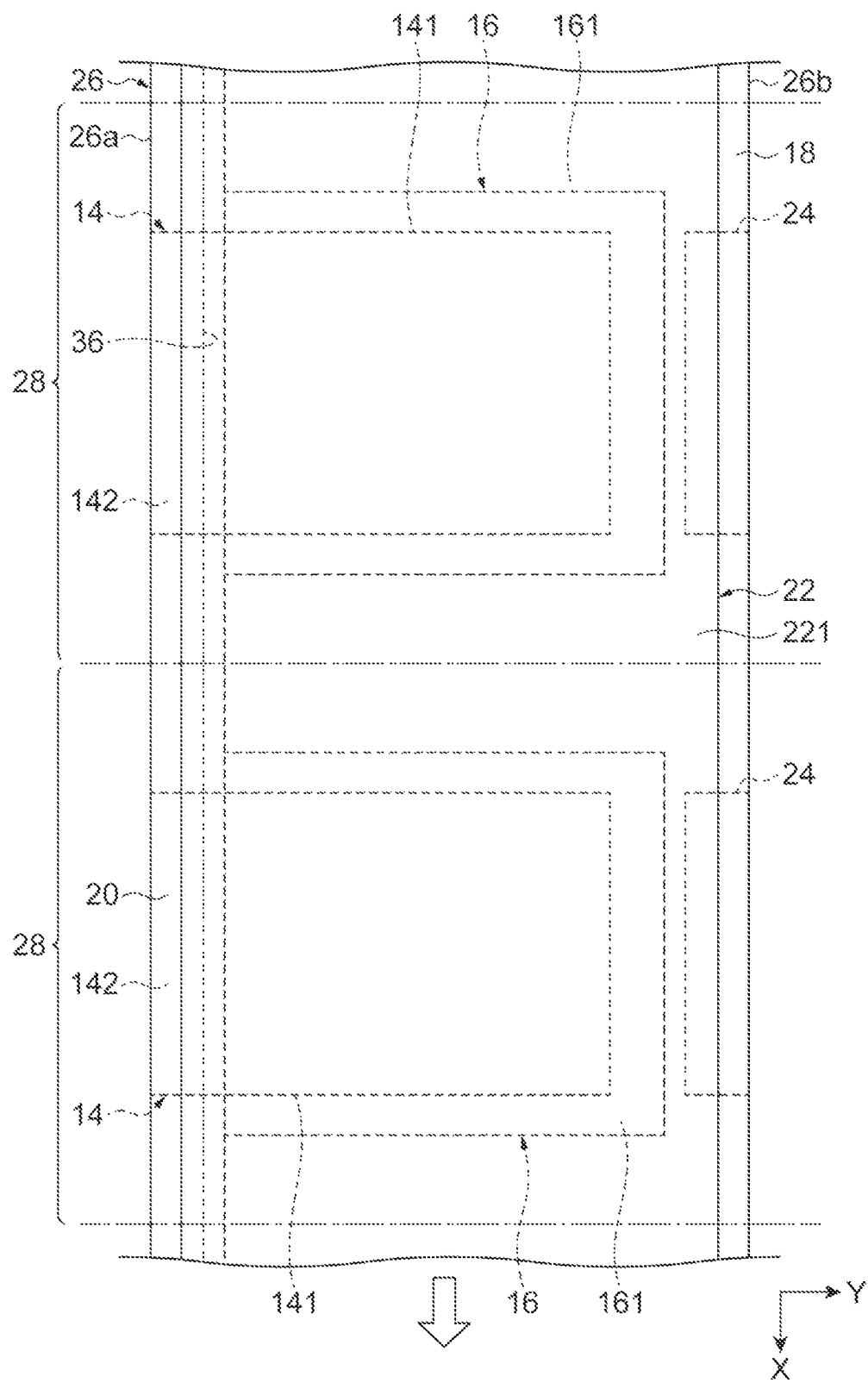
FIG. 9 is a drawing illustrating a bonding step.

By the above-described bonding step S14, as shown in FIG. 9, the electrode-attached substrate 26 to which the sealing member 22 extending in the longitudinal direction is bonded over the plurality of organic EL element formation areas 28 is obtained. By the bonding step S16, the groove section 36 with which the conductive film 34 is formed is filled with the adhesive part 222, and therefore the cathode 18 and the external connection part 142 are more reliably insulated.

Figure 4:
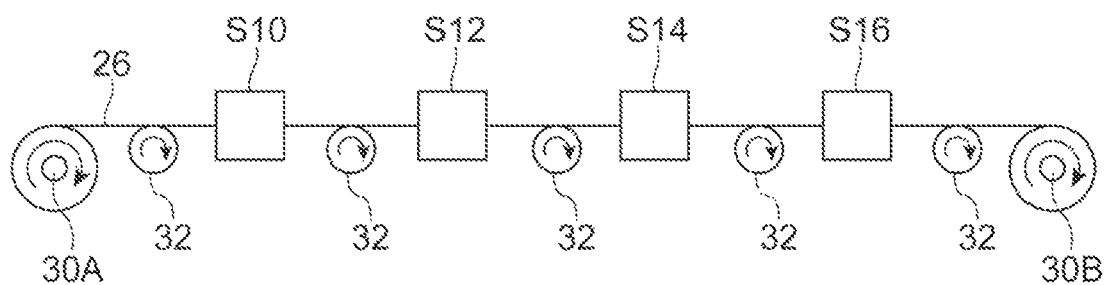
FIG. 4 is a drawing schematically illustrating a production method for producing an organic EL element by a roll-to-roll method.

As conceptually shown in FIG. 4, in the first embodiment, after the bonding step S16, the electrode-attached substrate 26 is wound onto the winding roll 30B.

(Cutting Step)

Figure 10:
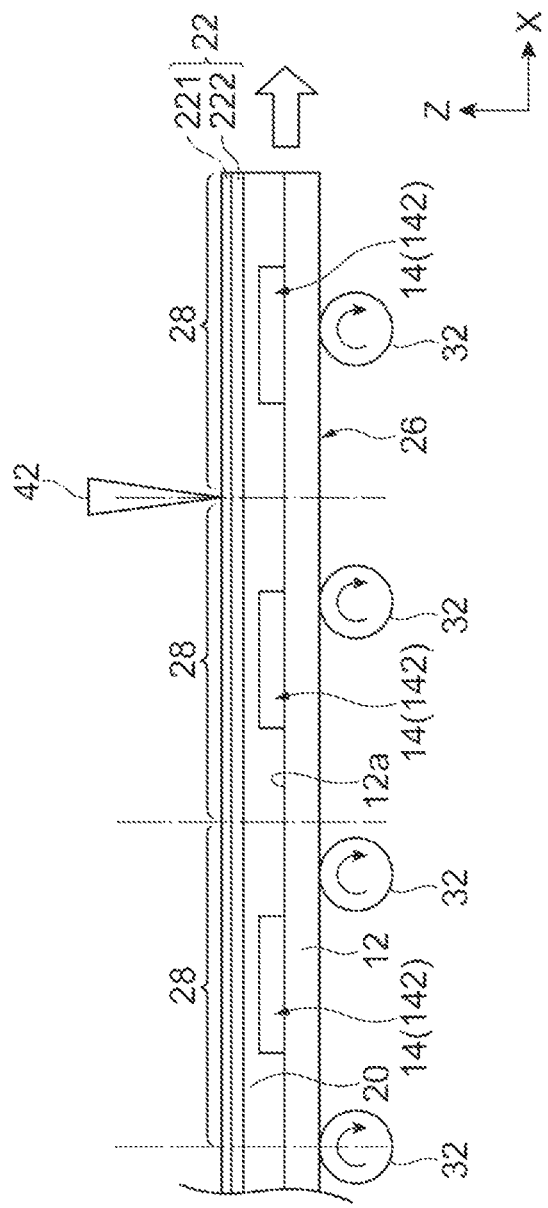
FIG. 10 is a drawing illustrating a cutting step.

In the cutting step S18, the electrode-attached substrate 26 subjected to the bonding step S14 and temporarily wound is further reeled out, and as shown in FIG. 10 that views the electrode-attached substrate 26 subjected to the bonding step S16 from the side, the electrode-attached substrate 26 is conveyed in the longitudinal direction of the electrode-attached substrate 26 by the conveying roller 32. In addition, while the electrode-attached substrate 26 is conveyed in the longitudinal direction, a cut is made between the adjacent organic EL element formation areas 28 in the width direction of the electrode-attached substrate 26 by a cutting device 42, thereby obtaining the organic EL element 10.

In the production method for producing the organic EL element 10 exemplified above, steps other than the cutting step S18 are continuously performed by a roll-to-roll method. However, for example, in a mode in which a clearance is provided between edge parts 26*a*, 26*b* of the electrode-attached substrate 26 and the organic EL element formation area 28, in a case where the organic EL element formation area 28 is hollowed out from the electrode-attached substrate 26 in the cutting step S18, and consequently the electrode-attached substrate 26 is conveyed with the electrode-attached substrate 26 partially left, the cutting step S18 may also be included in the roll-to-roll method up to the bonding step S16.

In contrast, the roll-to-roll method may also be employed for each of the organic EL section forming step S10, the conductive film forming step S12, the separation step S14, and the bonding step S16. In other words, the next step may be performed after the electrode-attached substrate 26 is temporarily wound in each of the organic EL section forming step S10, the conductive film forming step S12, the separation step S14, and the bonding step S16.

In the above-described production method, the electrode-attached substrate 26 is prepared beforehand. However, the production method may be further provided with, for example, a step of forming the anode 14 and the extraction electrode 24 on the long-length support substrate 12.

In the production method for producing the organic EL element 10, after the long-length conductive film 34 is formed along the conveying direction (the first direction), the conductive film 34 is formed with the groove section 36 extending in the conveying direction. This groove section 36 separates in an insulated manner the conductive film 34 into the first part 341 and the second part 342, thereby obtaining, from the conductive film 34, the cathode 18 and the conductive member 20 that are spaced away from each other in the Y axial direction. In this manner, while the electrode-attached substrate 26 is conveyed in the conveying direction, the conductive film 34 is removed in the predetermined area 38 to form the groove section 36 extending in the conveying direction, and consequently the cathode 18 is obtained. Therefore, for example, scanning of the laser beam L in the width direction is not required, and the cathode 18 can be continuously formed while the electrode-attached substrate 26 is conveyed. As the result, in the above-described production method, the productivity of the organic EL element 10 can be improved. The predetermined area 38 has only to be set so as to ensure the insulation between the first part 341 and the external connection part 142, and therefore the position adjustment of the predetermined area 38 in the Y-axis direction does not require high accuracy. From this point of view as well, the productivity of the organic EL element 10 can be improved.

The production method for producing the organic EL element described in the first embodiment is suitable for the production method based on the roll-to-roll method as exemplified. In the roll-to-roll method, each step of the production method for producing the organic EL element 10 can be continuously performed while the long-length electrode-attached substrate 26 is conveyed, and therefore an improvement in productivity is further enhanced.

In a mode in which the conductive film 34 is formed with the groove section 36 by using the laser beam L, it is easy to form the groove section 36 having a desired shape and a desired depth by adjusting the intensity and irradiation time of the laser beam L, and so on. In the first embodiment, the conductive film 34 is irradiated with the laser beam L in such a manner that the end 38a of the irradiation position of the laser beam L is located on the boundary 143 between the anode body part 141 and the external connection part 142. This enables the conductive film 34 to be selectively removed without substantially removing the organic EL section 16.

A part of the conductive film 34 removed and scattered by the laser beam L (hereinafter also referred to as "debris") becomes foreign matter from a standpoint of the produced organic EL element 10. When the organic EL section 16 is removed together with the conductive film 34, foreign matter (debris) increases, and consequently the quality of the organic EL element 10 may decrease. In contrast to this, as described above, if the conductive film 34 is selectively removed without substantially removing the organic EL section 16, foreign matter easily decreases, and therefore a degradation in quality of the organic EL element 10 hardly occurs. As the result, the organic EL element 10 that ensures constant quality can be efficiently produced.

With respect to a wavelength of the laser beam L with which the conductive film 34 is irradiated, if the absorbed amount by the conductive film 34 is larger than the absorbed amount by the organic EL section 16 at the wavelength, even when the side surface 16a of the organic EL section 16 is located in an irradiated region of the laser beam L, the laser beam L is mainly absorbed in the conductive film 34, and accordingly the conductive film 34 is mainly removed while the removal of the organic EL section 16 is suppressed. In this case, while the foreign object (debris) can be made decreased, an allowable width for position alignment of the laser beam L increases. Therefore, since the position alignment of the laser beam L becomes easy, the productivity of the organic EL element 10 is further improved, and the organic EL element 10 that ensures the constant quality can be easily produced.

In the above-described production method, the sealing member 22 is provided on the electrode-attached substrate 26 so as to cover the groove section 36 in the bonding step S14 even if the conductive film 34 is formed with the groove section 36. This sealing member 22 seals the side surface 16a that is an area exposed due to the groove section 36 in the organic EL section 16. Therefore, water is hard to infiltrate into the organic EL section 16, and accordingly the deterioration of the organic EL element 10 is suppressed. The groove section 36 is filled with the adhesive part 222 of the sealing member 22, and accordingly the side surface 18a of the cathode 18 is also covered with the adhesive part 222. Therefore, even in a case where the organic EL element 10 is bent, the cathode 18 and the conductive member 20 are prevented from coming in contact with each other, which leads to an improvement in reliability of the organic EL element 10.

The organic EL element 10 shown in FIGS. 1 and 2 can be preferably produced by the above-described production method for producing the organic EL element. Therefore, the organic EL element 10 has a configuration that enables an improvement in productivity. In the organic EL element 10, the conductive member 20 is set up on the external connection part 142, and the conductive member 20 is electrically connected to the external connection part 142. Accordingly, the conductive member 20 is also capable of functioning as an external connection area in the organic EL element 10. In this case, a terminal for supplying electric power to the anode body part 141 of the organic EL element 10 can be easily connected. In the configuration of the organic EL element 10, the connection terminal from the outside can be connected to the cathode 18 itself. Accordingly, a terminal for supplying electric power to the cathode 18 can be easily connected. From the viewpoint of directly connecting the cathode 18 and the terminal for supplying electric power to the cathode 18, it is not necessary to provide the extraction electrode 24. However, providing the extraction electrode 24 enhances the adhesiveness between the conductive film 34 and the electrode-attached substrate 26.

In the organic EL element 10, a part of the cathode 18 and a part of the conductive member 20 are not covered with the sealing member 22, and are exposed. However, employing a material insusceptible to water as a material of the cathode 18 enables the organic EL element 10 to be prevented from deteriorating.

Next, various modified examples of the first embodiment will be described.

In the first embodiment, as described above, a mode in which the predetermined area 38 is set in such a manner that the end 38a of the predetermined area 38 in the Y-axis direction is located on the boundary 143 has been exemplified. However, the predetermined area 38 has only to be set such that the first part 341, the second part 342 and the external connection part 142 to be formed are insulated by the groove section 36.

Figure 17:
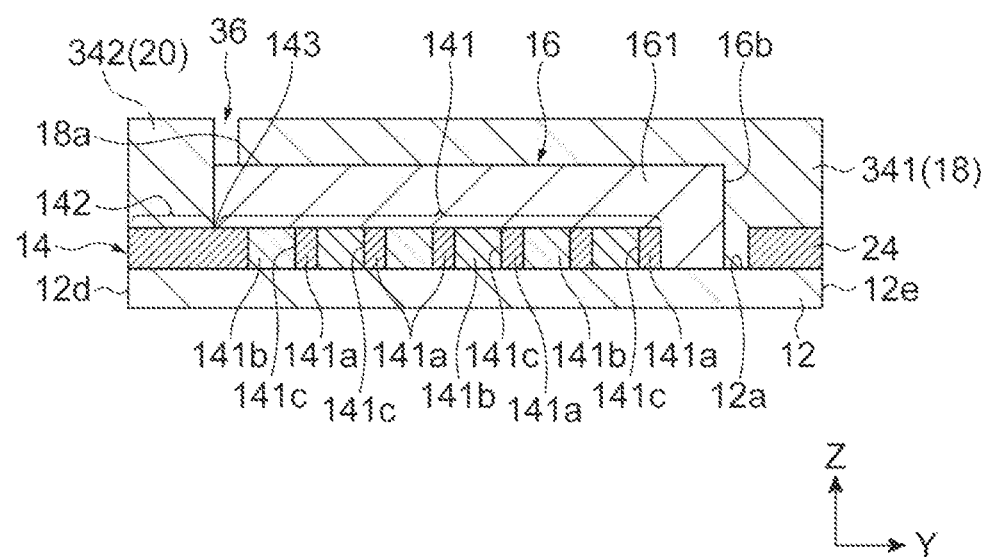
FIG. 17 is a drawing illustrating a modified example of a position at which a groove section is formed.

For example, the predetermined area 38 may be set on the boundary 143, or may be set on the organic EL section 16. In a case where the predetermined area 38 is set on the organic EL section 16 from the viewpoint of ensuring the cathode 18 having a constant size, in other words, a light-emitting area having a constant size (or a desired size) in the organic EL element 10, it is preferable that the predetermined area 38 is located in proximity to the side surface 16a of the organic EL section 16 before the separation step S14, and an end on the external connection part 142 side of the predetermined area 38 in the Y-axis direction may be located on the boundary 143. In a case where the predetermined area 38 is set on the organic EL section 16, as shown in FIG. 17, the groove section 36 can be formed on the upper surface (the surface on the opposite side of the support substrate 12) of the organic EL section 16. In this case as well, the infiltration of water into the organic EL section 16 can be prevented by sealing an area exposed due to the groove section 36 in the organic EL section 16 (in other words, a clearance area between the cathode 18 that is the first part 341 and the conductive member 20 that is the second part 342) using, for example, the sealing member 22. FIG. 17 is a drawing illustrating a modified example of a position at which the groove section 36 is formed, and schematically illustrates a cross sectional configuration obtained in a case where the electrode-attached substrate 26 after the completion of the separation step S14 is cut by a plane orthogonal to a longitudinal direction thereof.

In a case where the predetermined area 38 is set on the organic EL section 16, the organic EL section 16 may be removed. However, it is preferable that the organic EL section 16 is partially removed; and it is more preferable that only the conductive film 34 is removed. This is because the removal enables the amount of debris to be further reduced. In a case where the predetermined area 38 is set on the organic EL section 16, and in a case where the conductive film 34 is removed by the laser beam L, it is preferable that the laser beam L has a wavelength at which the absorbed amount by the conductive film 34 is larger than the absorbed amount by the organic EL section 16. This is because the above wavelength enables the removal of the organic EL section 16 caused by the irradiation with the laser beam L to be suppressed.

In the first embodiment, the method for producing the organic EL element 10A by using the long-length support substrate 12 has been exemplified. However, the organic EL element 10 may be produced by the method described in the first embodiment while a sheet of support substrate (or electrode-attached substrate) is conveyed. In this case, the support substrate 12 does not need to have flexibility. The support substrate 12 can be, for example, a rigid substrate such as a glass substrate and a silicon substrate.

The organic EL element 10 does not need to include the sealing member 22. In a mode in which the organic EL element 10 does not include the sealing member 22, for example, the organic EL element 10 may also be accommodated in a sealing case in order to prevent the organic EL section 16 from deteriorating. In a case where the organic EL element 10 that is not provided with the sealing member 22 is produced by using a long-length electrode-attached substrate, it is enough that the production method includes an organic EL section forming step, a conductive film forming step, a separation step, and a cutting step. Meanwhile, in a case where the organic EL element 10 that is not provided with the sealing member 22 is produced using a sheet of electrode-attached substrate, it is enough that the production method includes an organic EL section forming step, a conductive film forming step, and a separation step.

Second Embodiment

A production method for producing an organic EL element, and the organic EL element, according to the second embodiment will be described. The organic EL element 10A produced by the production method for producing an organic EL element according to the second embodiment shown in FIG. 11 mainly differs from the configuration of the organic EL element 10 in that the organic EL element 10A includes an insulation section 44 that is provided so as to come in contact with the side surface 16a of the organic EL section 16. The organic EL element 10A will be described focusing on this point of difference. In the second embodiment as well, unless otherwise specified, the organic EL section 16 has a single layer structure, and is configured from the light-emitting layer 161.

The insulation section 44 is provided on the external connection part 142 so as to come in contact with the organic EL section 16. In this case, the side surface 44a (interface between the organic EL section 16 and the insulation section 44) of the insulation section 44 is located on the boundary 143 between the anode body part 141 and the external connection part 142. Examples of a material of the insulation section 44 include photosensitive polyimide resin, acrylic resin, epoxy resin, and phenolic resin. Specifically, the material can be a resist material. An example of a thickness of the insulation section 44 is not limited. However, an example of the thickness is 0.1 μm to 10 μm.

In the organic EL element 10A, the clearance g between the cathode 18 and the conductive member 20 is located on the insulation section 44. In other words, a surface that faces the conductive member 20 in the cathode 18, and a surface that faces the cathode 18 in the conductive member 20, are located on the insulation section 44.

The production method for producing the organic EL element 10A mainly differs from the production method for producing the organic EL element 10 in that the production method for producing the organic EL element 10A includes an insulation section forming step of forming the insulation section 44 before the conductive film forming step S12 shown in FIG. 4. An example of the production method for producing the organic EL element 10A will be described focusing on this point of difference.

Figure 12:
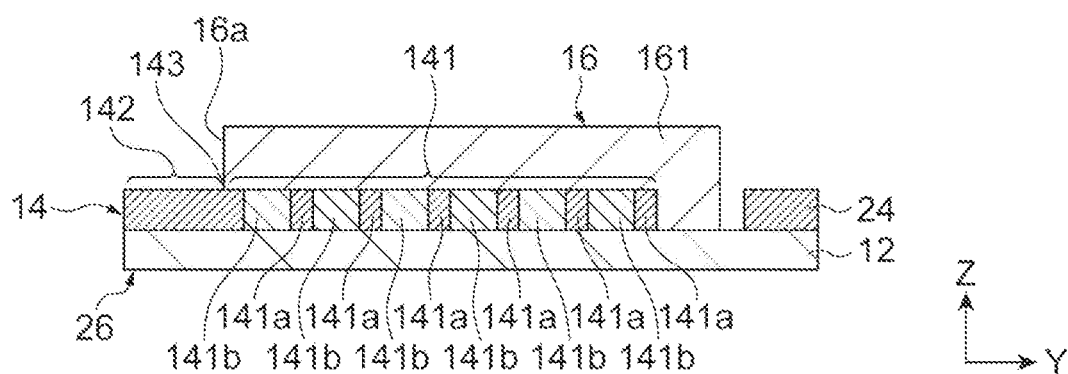
FIG. 12 is a drawing illustrating a production method for producing an organic EL element according to the second embodiment, FIG. 12(a) schematically illustrates a cross sectional configuration of an electrode-attached substrate in order to explain an organic EL section forming step, and FIG. 12(b) schematically illustrates a cross sectional configuration of an electrode-attached substrate in order to explain an insulation section forming step, and FIG. 12(c) schematically illustrates a cross sectional configuration of an electrode-attached substrate in order to explain a conductive film forming step.
Figure 12:
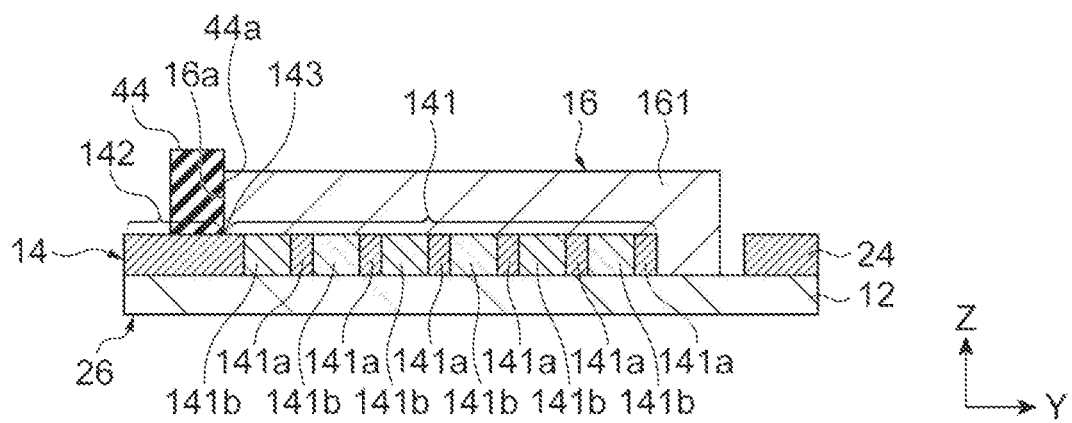
Figure 12:
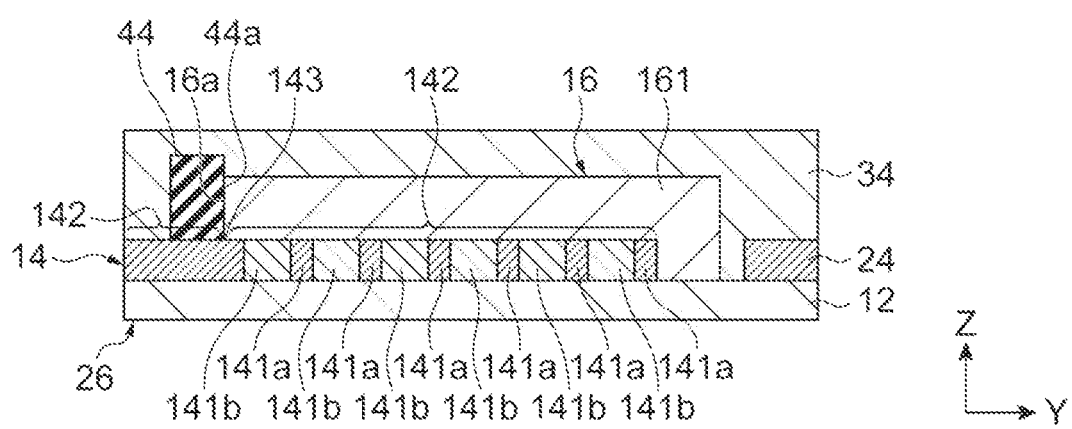

In a case where the organic EL element 10A is produced, as with the first embodiment, the organic EL section forming step is performed to form the organic EL section 16 on the electrode-attached substrate 26 as shown in FIG. 12(a). Subsequently, the insulation section forming step is performed to form the insulation section 44 on the external connection part 142 in such a manner that the side surface 44a is located on the boundary 143 between the anode body part 141 and the external connection part 142 as shown in FIG. 12(b). Consequently, the side surface 44a of the insulation section 44 comes in contact with the side surface 16a of the organic EL section 16. In the insulation section forming step, while the electrode-attached substrate 26 on which the organic EL section 16 is formed is conveyed in a longitudinal direction thereof, the insulation section 44 is formed by, for example, a coating method. An example of the coating method is an inkjet printing method. Subsequently, while the electrode-attached substrate 26 on which the insulation section 44 is formed is conveyed, the conductive film 34 is formed as shown in FIG. 12(c) as with the conductive film forming step S12 in the first embodiment.

Figure 13:
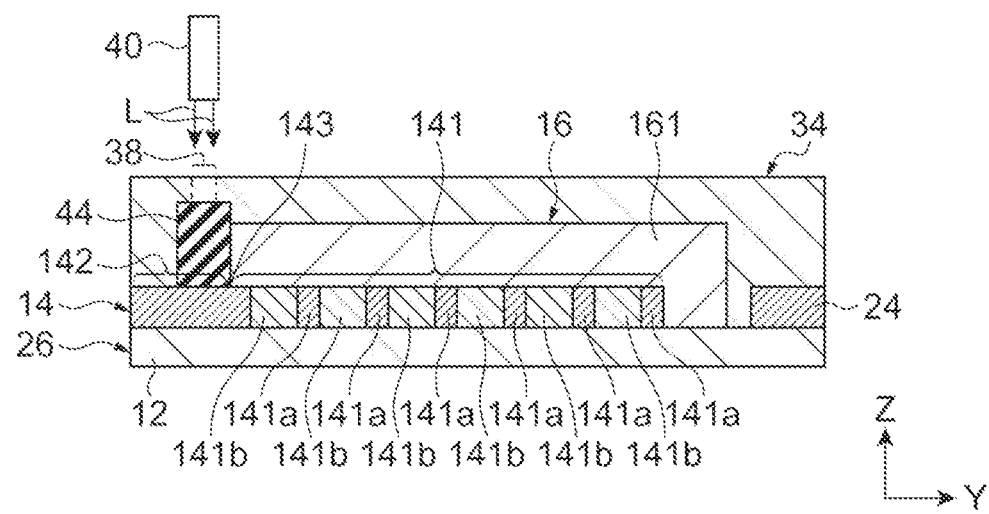
FIG. 13 is a drawing illustrating a separation step in the production method for producing the organic EL element according to the second embodiment, FIG. 13(a) schematically illustrates a cross sectional configuration of an electrode-attached substrate after the formation of a conductive film in order to explain the separation step, and FIG. 13(b) schematically illustrates a cross sectional configuration of the electrode-attached substrate after the separation step.
Figure 13:
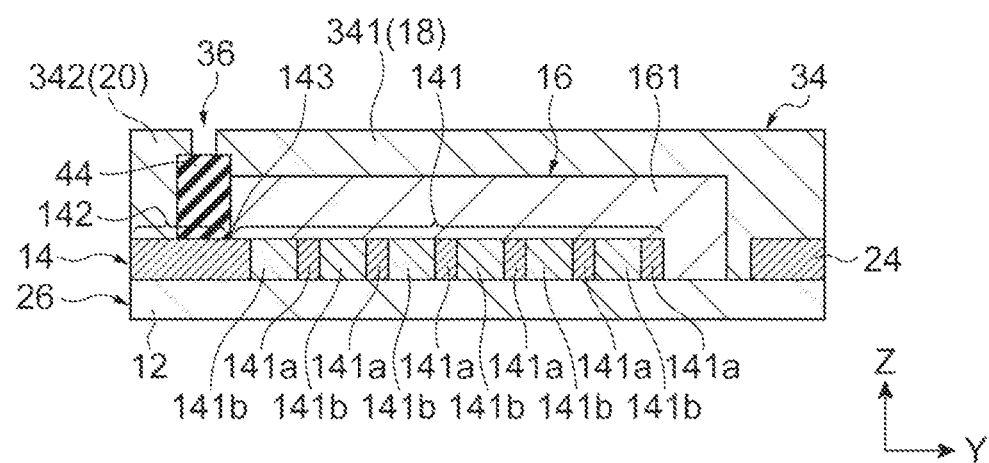

In the separation step S14 performed after the conductive film forming step S12, as shown in FIG. 13(a), the predetermined area 38 is set in an area in which the insulation section 44 is formed in the Y-axis direction, and the predetermined area 38 is irradiated with the laser beam L from the laser device 40 to form the groove section 36 as shown in FIG. 13(b). In the separation step S14, as with the first embodiment, while the electrode-attached substrate 26 is conveyed in the longitudinal direction of the electrode-attached substrate 26, the predetermined area 38 is irradiated with the laser beam L from the laser device 40. Consequently, the groove section 36 extending in the X-axis direction is formed.

In the second embodiment, only the conductive film 34 on the insulation section 44 is removed. However, a part of the insulation section 44 may be removed by being irradiated with the laser beam L. From the viewpoint of reducing a size of a foreign object with respect to the organic EL element 10A, it is preferable that the insulation section 44 is hardly removed.

The laser beam L may be pulse irradiated as with, for example, the first embodiment. A wavelength of the laser beam L has only to be a wavelength absorbed by the conductive film 34. It is preferable that the laser beam L has a wavelength at which the absorbed amount of the laser beam L by the conductive film 34 is larger than the absorbed amount of the laser beam L by the insulation section 44. It is more preferable that the laser beam L has a wavelength at which the laser beam L is not substantially absorbed by the insulation section 44. Consequently, while irradiation conditions, such as the irradiation time, for preventing the insulation section 44 from being removed by the irradiation with the laser beam L, are eased, cutting of the insulation section 44 by the laser beam L can be suppressed.

After the separation step S14, as with the first embodiment, the organic EL element 10A can be obtained by performing the bonding step S16 and the cutting step S18.

The insulation section forming step may be performed before the organic EL section forming step S10, or may be performed after the organic EL section forming step S10, so long as the insulation section forming step is performed before the conductive film forming step S12. In the separation step S14, the example in which the conductive film 34 is removed by the laser beam L has been described. However, as with the first embodiment, the conductive film 34 may be removed by a method other than the method that uses the laser beam L.

The production method for producing the organic EL element according to the second embodiment is similar to the production method according to the first embodiment with the exception that the production method according to the second embodiment is provided with the insulation section forming step. Therefore, the production method according to the second embodiment has effects that are at least similar to those of the production method for producing the organic EL element according to the first embodiment.

In the above-described production method, a part provided with the insulation section 44 in the external connection part 142 is insulated from the conductive film 34 by the insulation section 44 at the time of the completion of the conductive film forming step S12. Accordingly, by removing the conductive film 34 at a position of the insulation section 44 to form the groove section 36, the insulation between the external connection part 142 and the first part 341 (the cathode 18) can be easily ensured. Therefore, position adjustment of the predetermined area 38 is easy. Accordingly, it is easy to increase the productivity of the organic EL element 10A.

The conductive film 34 on the insulation section 44 can be thinned in comparison with a case where the insulation section 44 is not provided. Therefore, in the above-described production method, the amount of the conductive film 34 to be removed is also small. As the result, a degradation in quality of the organic EL element 10A is further suppressed, the degradation in quality being caused by the conductive film 34 scattered due to removing the conductive film 34, and then adheres to the organic EL element 10A as a foreign object.

In the second embodiment as well, by the bonding step S14, the sealing member 22 is bonded to the electrode-attached substrate 26 subjected to the separation step S16. Therefore, the side surface 16a of the organic EL section 16 is sealed with the sealing member 22. Accordingly, as with the first embodiment, water is hard to infiltrate into the organic EL section 16, and thus the deterioration of the organic EL element 10 is suppressed. In the second embodiment as well, the groove section 36 is filled with the adhesive part 222, and therefore, even when the organic EL element 10A is bent, as with the first embodiment, the cathode 18 and the conductive member 20 are prevented from coming in contact with each other, which leads to an improvement in reliability of the organic EL element 10A.

Figure 11:
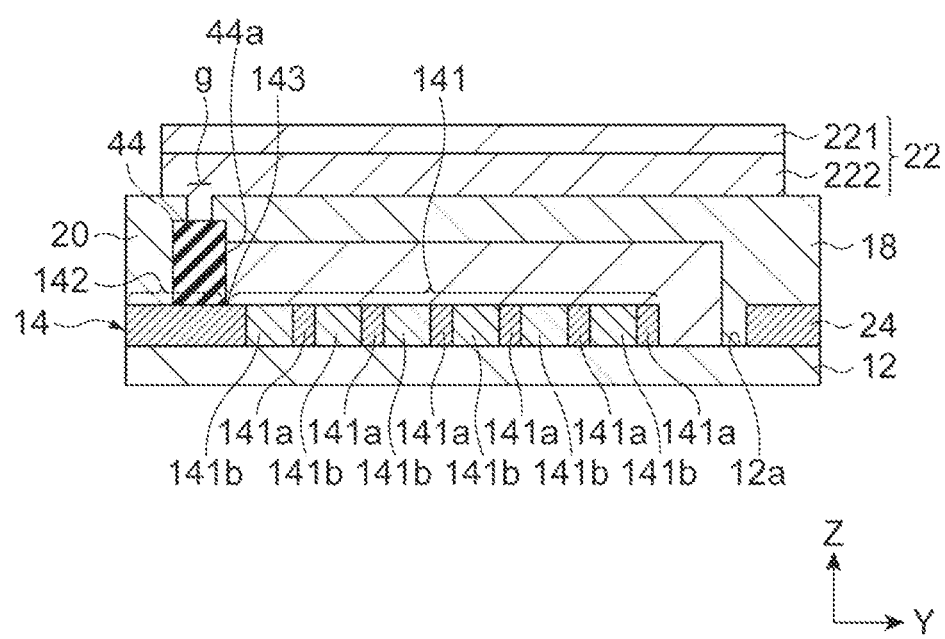
FIG. 11 is a drawing illustrating a schematic configuration of an organic EL element according to a second embodiment.

The organic EL element 10A shown in FIG. 11 can be preferably produced by the production method for producing the organic EL element exemplified in the second embodiment. Therefore, the organic EL element 10A has a configuration that enables an improvement in productivity. Effects on the conductive member 20 and the cathode 18 in the organic EL element 10A are similar to those in the case of the first embodiment. In the second embodiment as well, it is not necessary to provide the extraction electrode 24. However, as with the first embodiment, the adhesiveness between the conductive film 34 and the electrode-attached substrate 26 is improved by providing the extraction electrode 24.

Next, various modified examples of the second embodiment will be described.

In the second embodiment as well, as described in the modified example of the first embodiment, while a sheet of support substrate (or electrode-attached substrate) is conveyed, the organic EL element 10A may be produced by the method described in the second embodiment. In this case, not requiring the support substrate 12 to have flexibility is also similar to the first embodiment.

The organic EL element 10A does not need to include the sealing member 22. In a mode in which the organic EL element 10A does not include the sealing member 22, as described in the modified example of the first embodiment, for example, the organic EL element 10A may also accommodated in a sealing case in order to prevent the organic EL section 16 from deteriorating. In a case where the organic EL element 10A that does not include sealing member 22 is produced by using a long-length electrode-attached substrate, it is enough that the production method includes the organic EL section forming step S10, an insulation section forming step, the conductive film forming step S12, the separation step S14, and the cutting step S18. Meanwhile, in a case where the organic EL element 10A that does not include the sealing member 22 is produced by using a sheet of electrode-attached substrate, it is enough that the production method includes the organic EL section forming step S10, an insulation section forming step, the conductive film forming step S12, and the separation step S14.

Third Embodiment

A production method for producing an organic EL element, and the organic EL element, according to the third embodiment will be described. The organic EL element 10B produced by the production method for producing an organic EL element according to the third embodiment shown in FIG. 14 mainly differs from the configuration of the organic EL element 10 in that a moisture absorbing section 46 is provided between the organic EL section 16 and the conductive member 20. The organic EL element 10B will be described focusing on this point of difference. In the third embodiment as well, unless otherwise specified, the organic EL section 16 has a single layer structure, and is configured from the light-emitting layer 161.

The moisture absorbing section 46 is provided on the external connection part 142 so as to come in contact with the organic EL section 16. In this case, an interface between the organic EL section 16 and the moisture absorbing section 46 is located on the boundary 143 between the anode body part 141 and the external connection part 142. The moisture absorbing section 46 is a desiccant material that captures water. The moisture absorbing section 46 may capture oxygen other than water. It is preferable that a moisture-absorbing rate of the moisture absorbing section 46 is 1 wt %/h or higher under an environment in which a temperature is 24° C., and a humidity is 55% RH.

The moisture absorbing section 46 has insulation performance. The moisture absorbing section 46 is formed by hardening a liquid getter material that is a precursor of the moisture absorbing section 46. Accordingly, the moisture absorbing section 46 is a hardened material of the liquid getter material. The liquid getter material is capable of containing a crosslinkable compound (curing component) having an optical reactive group. In this case, the liquid getter material is hardened by irradiating the liquid getter material with light (for example, ultraviolet light) that causes the above-described crosslinkable compound to react. Alternatively, the liquid getter material may contain a crosslinkable compound having a thermally reactive group. In this case, the liquid getter material is hardened by heating.

It is preferable that the moisture absorbing section 46 contains, as a liquid getter material, at least one kind of an organometallic compound, metallic oxide, and an a porous substance such as zeolite. Moreover, it is preferable that metal that forms the organometallic compound and the metallic oxide contains at least one kind of aluminum, calcium, and barium. In particular, the organoaluminum compound and calcium oxide are fast in water-refilling speed, and therefore are more preferable.

The moisture absorbing section 46 may contain a binder. In particular, the moisture absorbing section 46 may contain at least one kind of acrylic-based resin, epoxy resin, styrenic resin, olefine resin, and amide-based resin.

The production method for producing the organic EL element 10B mainly differs from the production method for producing the organic EL element 10 in that there is provided a moisture absorbing section forming step of forming the moisture absorbing section 46 after the separation step S14 shown in FIG. 4. An example of the production method for producing the organic EL element 10B will be described focusing on this point of difference.

Figure 15:
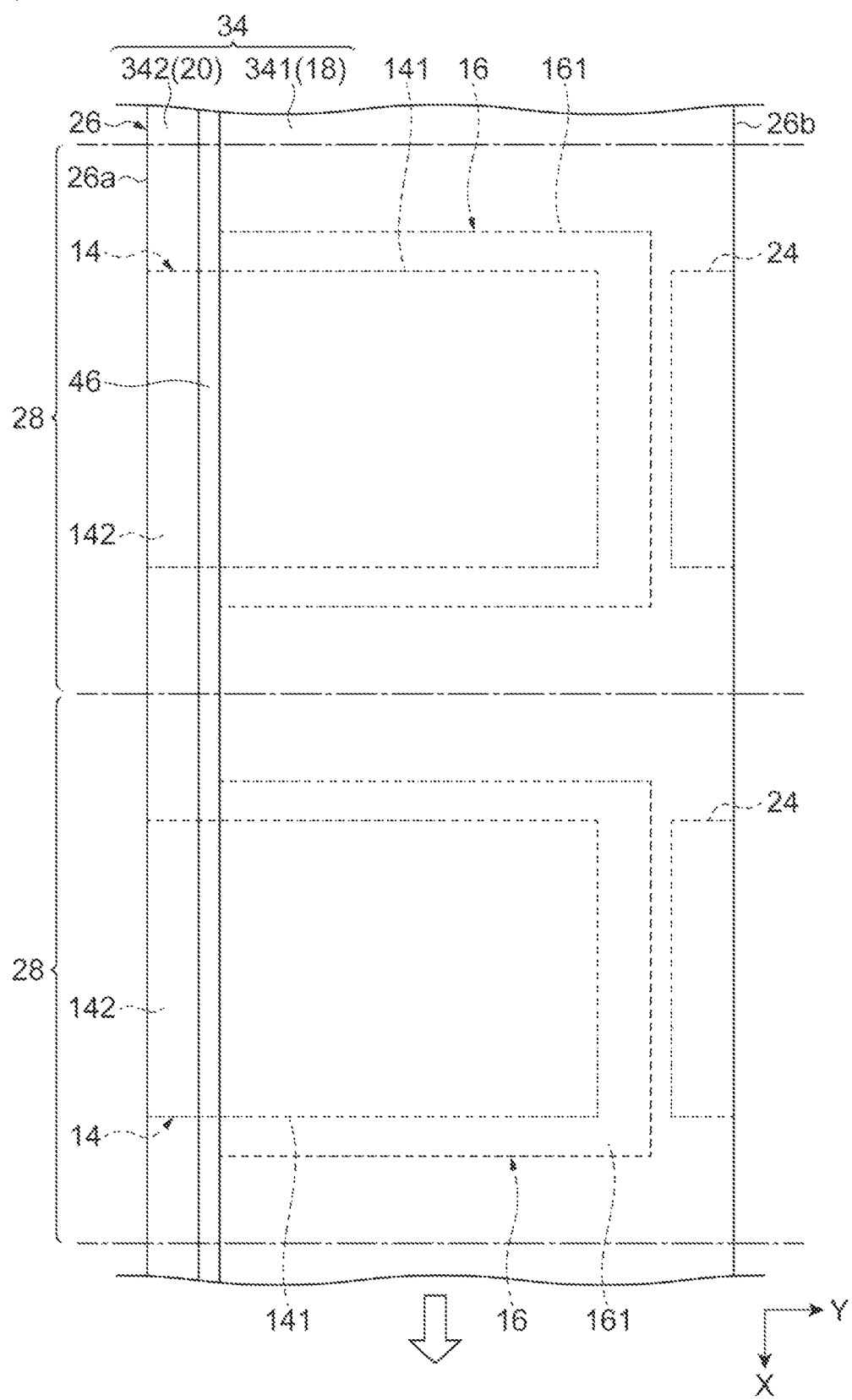
FIG. 15 is a drawing illustrating a moisture absorbing section forming step in the production method for producing an organic EL element according to the third embodiment.

In a case where the organic EL element 10B is produced, as with the first embodiment, by performing steps up to the separation step S16, the conductive film 34 is formed with the groove section 36 as shown in FIG. 7. Subsequently, the moisture absorbing section forming step is performed to form the moisture absorbing section 46 in the groove section 36 as shown in FIG. 15. Specifically, in the moisture absorbing section forming step, first of all, while the electrode-attached substrate 26 subjected to the separation step S16 is conveyed in the longitudinal direction, a liquid getter material to be the moisture absorbing section 46 is applied in the groove section 36 so as to fill the groove section 36 with the liquid getter material by a coating method such as an inkjet printing method. Subsequently, by hardening the applied liquid getter material, the moisture absorbing section 46 is formed. As a hardening method for hardening the liquid getter material, a method based on hardening characteristics of the liquid getter material suffices.

After the moisture absorbing section forming step, as with the first embodiment, the organic EL element 10B can be obtained by performing the bonding step S16 and the cutting step S18.

The production method for producing the organic EL element 10B is similar to the production method for producing an organic EL element in the first embodiment with the exception that the moisture absorbing section forming step is further provided. Accordingly, the production method for producing the organic EL element 10B has effects that are at least similar to those of the production method for producing the organic EL element in the first embodiment.

In the moisture absorbing section forming step, the liquid getter material is applied to the groove section 36 so as to fill the groove section 36 with the liquid getter material. Subsequently, the liquid getter material is hardened to form the moisture absorbing section 46. Consequently, the side surface 16a of the organic EL section 16 is covered with the moisture absorbing section 46, and therefore infiltration of water into the organic EL section 16 is suppressed. As the result, the product lifetime of the organic EL element 10B can be extended. The moisture absorbing section 46 is formed by applying the liquid getter material to the groove section 36 while the electrode-attached substrate 26 subjected to the separation step S14 is conveyed, and then by drying the liquid getter material. Therefore, the productivity of the organic EL element 10B provided with the moisture absorbing section 46 can be enhanced.

Figure 14:
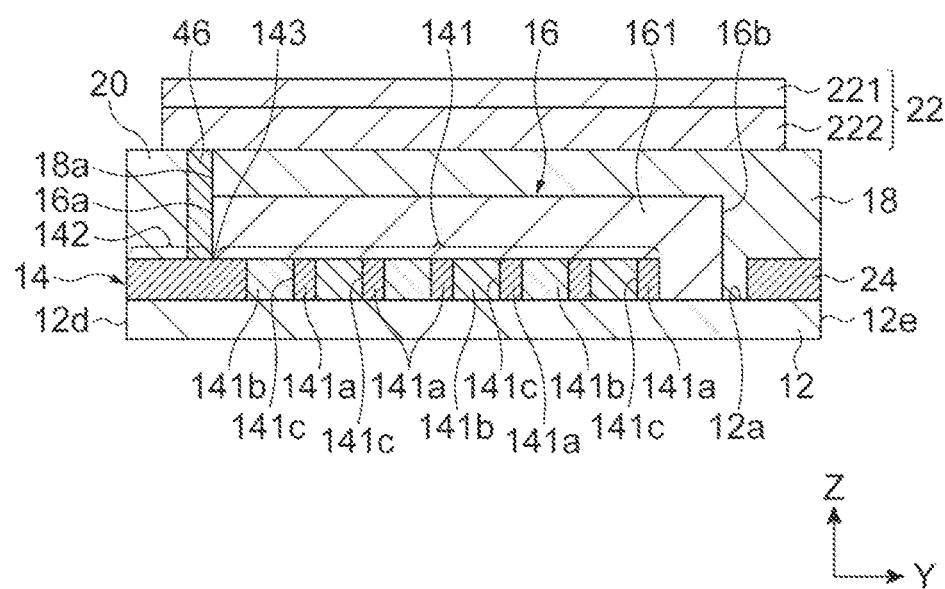
FIG. 14 is a drawing illustrating a moisture absorbing section forming step in a production method for producing an organic EL element according to a third embodiment.

The organic EL element 10B shown in FIG. 14 can be preferably produced by the production method for producing the organic EL element exemplified in the third embodiment. Therefore, the organic EL element 10B has a configuration that enables an improvement in productivity. Effects on the conductive member 20 and the cathode 18 in the organic EL element 10B are similar to those in the case of the first embodiment. In the third embodiment as well, it is not necessary to provide the extraction electrode 24. However, as with the first embodiment, the adhesiveness between the conductive film 34 and the electrode-attached substrate 26 is improved by providing the extraction electrode 24.

In the organic EL element 10B, the moisture absorbing section 46 is provided between the organic EL section 16 and the conductive member 20, and therefore the side surface 18a of the cathode 18 is also covered with the insulative moisture absorbing section 46. Accordingly, for example, when the organic EL element 10B is bent, the cathode 18 and the conductive member 20 are reliably prevented from coming in contact with each other, resulting in short-circuiting therebetween. Therefore, with respect to the organic EL element 10B and the production method thereof, an improvement in reliability of the organic EL element 10B is achieved.

Next, various modified examples of the third embodiment will be described.

In the third embodiment as well, as described in the modified example of the first embodiment, while a sheet of support substrate (or electrode-attached substrate) is conveyed, the organic EL element 10B may be produced by the method described in the third embodiment. In this case, not requiring the support substrate 12 to have flexibility is also similar to the first embodiment.

The organic EL element 10B does not need to include the sealing member 22. In the organic EL element 10B, the side surface 16a that is an area exposed due to the groove section 36 in the organic EL section 16 is covered with the moisture absorbing section 46. Therefore, even if the sealing member 22 is not provided, it is possible to prevent water from infiltrating from the side surface 16a into the organic EL section 16. In a case where the organic EL element 10B that does not include the sealing member 22 is produced by using a long-length electrode-attached substrate, it is enough that the production method includes the organic EL section forming step S10, the conductive film forming step S12, the separation step S14, the moisture absorbing section forming step, and the cutting step S18. Meanwhile, in a case where the organic EL element 10B that does not include the sealing member 22 is produced by using a sheet of electrode-attached substrate, it is enough that the production method includes the organic EL section forming step S10, the conductive film forming step S12, the separation step S14, and the moisture absorbing section forming step.

As shown in FIG. 14, in a mode in which the moisture absorbing section 46 is formed so as to cover the side surface 16a of the organic EL section 16, the Y-axis direction width of the moisture absorbing section 46 may be narrower than the width of the groove section 36. The height of the moisture absorbing section 46 has only to be higher than the height of the side surface 16a. Therefore, in the moisture absorbing section forming step, it is not necessary to form the moisture absorbing section 46 in such a manner as to bury the groove section 36.

Figure 18:
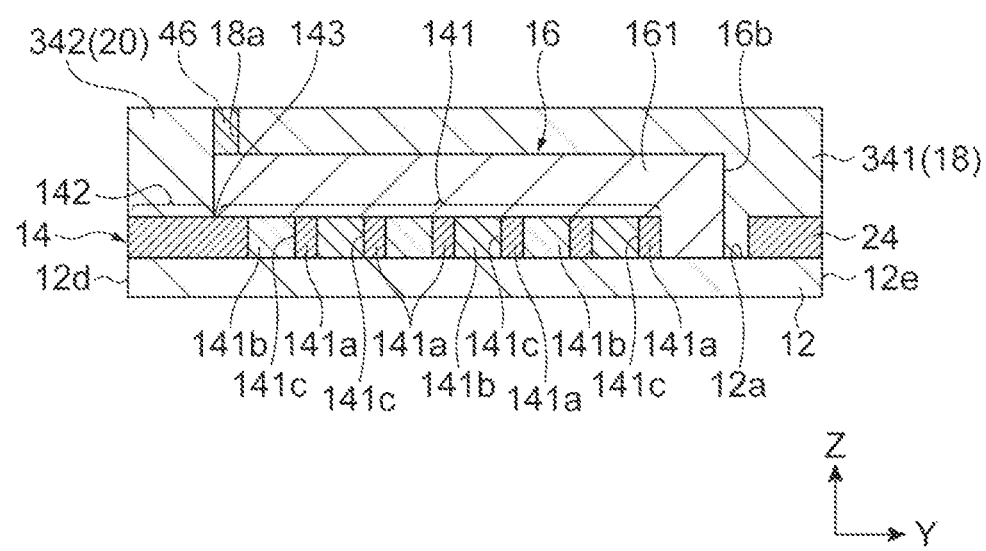
FIG. 18 is a drawing illustrating a modified example of a position at which a moisture absorbing section is formed.

As described by using FIG. 17 in the modified example of the first embodiment, in a mode in which the groove section 36 is formed on the upper surface (the surface on the opposite side of the support substrate 12) of the organic EL section 16, the moisture absorbing section 46 can be formed on the organic EL section 16 by the moisture absorbing section forming step as shown in FIG. 18. Forming the moisture absorbing section 46 in this manner enables water to be more reliably prevented from infiltrating, into the organic EL section 16, from an area exposed due to the groove section 36 in the organic EL section 16 (in other words, a clearance area between the cathode 18 and the conductive member 20). The height of the moisture absorbing section 46 may be higher than or equal to the height of the groove section 36 (or the thickness of a part located on the upper surface of the organic EL section 16 in the cathode 18), or may be lower than the height of the groove section 36.

Various embodiments of the present invention have been explained as above. However, the present invention is not limited to the above-described various embodiments. The present invention can be changed in various ways within the scope that does not deviate from the gist of the present invention.

Figure 16:
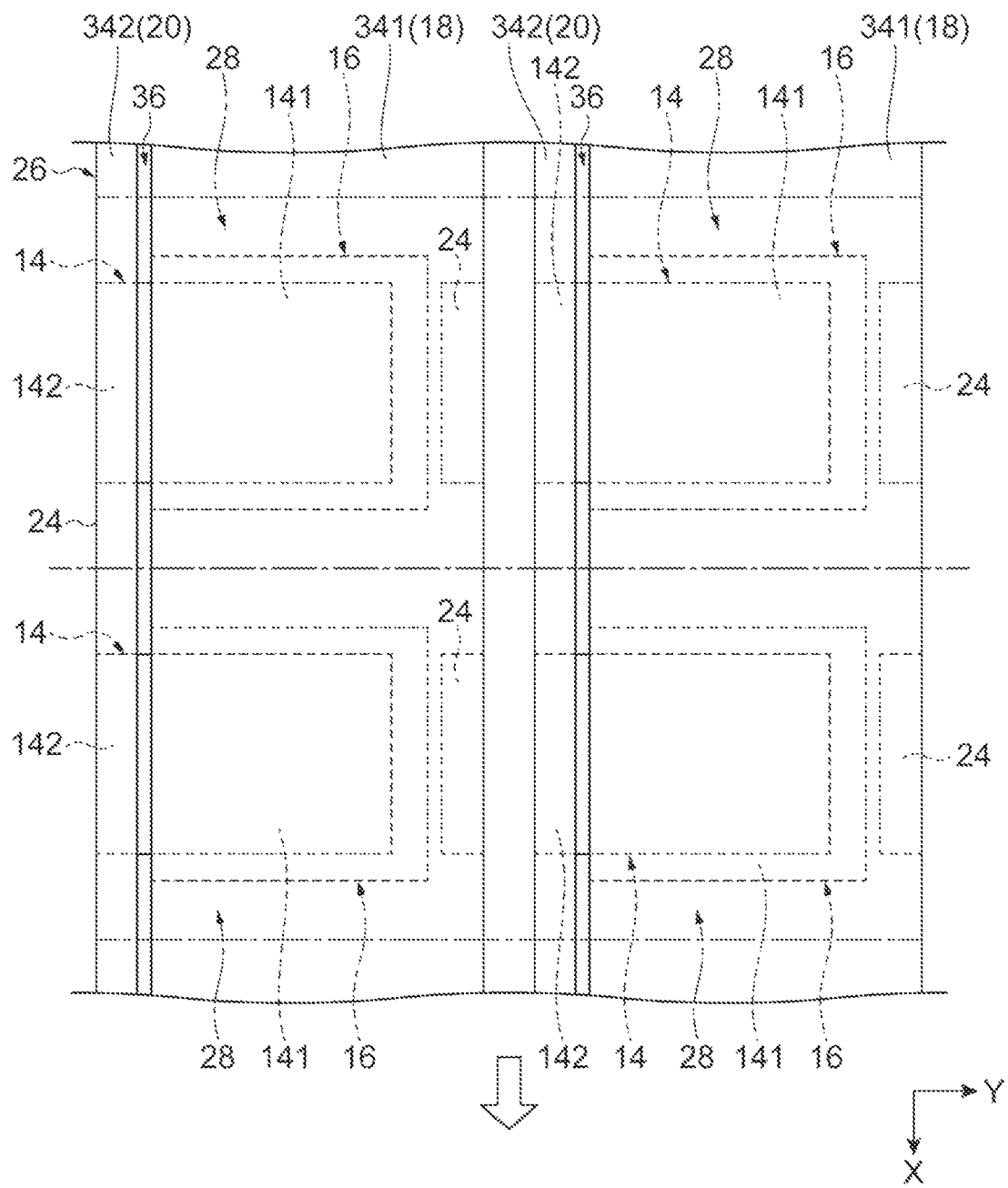
FIG. 16 is a drawing illustrating a modified example of a production method for producing an organic EL element.

As shown in FIG. 16, when the organic EL element 10 according to the first embodiment is produced, the plurality of the organic EL element formation areas 28 may also be set in the support substrate 12 (or the electrode-attached substrate 26) in the width direction of the support substrate 12. FIG. 16 is a drawing schematically illustrating a plan view of an electrode-attached substrate subjected to the separation step. In a case where the plurality of organic EL element formation areas 28 are also set in the width direction of the support substrate 12, as shown in FIG. 16, a plurality of columns of the organic EL element formation areas 28, which are set along the longitudinal direction (conveying direction) of the support substrate 12, have only to be formed with the groove sections 36 respectively. In this mode, in the conductive film forming step, a conductive film is formed so as to cover the whole support substrate 12, and in the separation step, the groove section 36 is formed and a separation may be made between the plurality of columns of the organic EL element formation areas 28, or in the conductive film forming step, a conductive film may be formed for each of the plurality of columns of the organic EL element formation areas 28. In the second and third embodiments as well, the plurality of the organic EL element formation areas 28 may also be similarly set in the width direction of the support substrate 12.

It is enough that the conductive film 34 is linearly formed on the main surface 12a of the support substrate 12 so as to cover at least a part of the external connection part 142 and the organic EL section 16. Accordingly, the width of the conductive film 34 may be narrower than that of the support substrate 12. In a mode in which the width of the conductive film 34 is narrower than that of the support substrate 12, in a case where the organic EL element includes the sealing member 22, the Y-axis direction width of the sealing member 22 may be narrower than the width of the conductive film 34. In a mode in which the width of the conductive film 34 is narrower than that of the support substrate 12, in a case where the organic EL element includes the sealing member 22, the conductive member 20 may be sealed with the sealing member 22 so long as a part of the external connection part 142 is pulled out from the sealing member 22 to the outside. Similarly, as exemplified in the first to third embodiments, in a case where the extraction electrode 24 is provided, the cathode 18 may be sealed with the sealing member 22 so long as a part of the extraction electrode 24 is pulled out from the sealing member 22. The conductive film 34 does not need to cover the whole organic EL element formation area 28 in the X-axis direction. In this case, both side surfaces of the conductive film 34 in the X-axis direction can also be covered with the adhesive part 222. In a mode in which the whole peripheral surface of the conductive film 34 is covered with the adhesive part 222, the cathode 18 and the conductive member 20 are buried in the adhesive part 222. Therefore, the known cathode material used in the organic EL element can be employed as a material of the cathode 18 and the conductive member 20.

As an organic EL element, the mode in which light is emitted from the anode has been explained. However, the organic EL element can also take a mode in which light is emitted from the cathode side. Moreover, the description has been given on the assumption that the first electrode section is the anode, and the second electrode section is the cathode. However, the first electrode section may be a cathode, and the second electrode section may be an anode.

REFERENCE SIGNS LIST 10, 10A Organic EL element
12 Support substrate (substrate)

12a Main surface
14 Anode (first electrode section)
18 Cathode (second electrode section)
20 Conductive member
26 Electrode-attached substrate
28 Organic EL element formation area
34 Conductive film
36 Groove section
38 Predetermined area
38a End
44 Insulation section
44a Side surface
46 Moisture absorbing section
141 Anode body part (organic EL section arrangement area)
142 External connection part (external connection area)
143 Boundary
161 Light-emitting layer
341 First part
342 Second part

The invention claimed is:

1. An organic EL element comprising:
a supporting substrate;
a first electrode section provided on a main surface of the supporting substrate;
an organic EL section provided on the first electrode section and including a light-emitting layer; and
a second electrode section provided on the organic EL section and configured to supply electric power to the organic EL section in conjunction with the first electrode section,
wherein the first electrode section includes:
an organic EL section arrangement area on which the organic EL section is arranged; and
an external connection area being in contact with the organic EL section arrangement area in a predetermined direction and for externally connecting the organic EL section arrangement area, and
wherein a conductive member is provided on the external connection area, arranged apart from the second electrode section in the predetermined direction, and formed of the same material as a material of the second electrode section,
wherein the organic EL element further comprises a sealing member provided on the second electrode section, the conductive member and a clearance between the second electrode section and the conductive member,
wherein a width of the sealing member is shorter than a width of the supporting substrate in the predetermined direction, and
wherein, when the organic EL element is viewed from a thickness direction thereof, a side of an end of the second electrode section opposite to the clearance and a side of an end of the conductive member opposite to the clearance in the predetermined direction are exposed from the sealing member.

2. The organic EL element according to claim 1,
further comprising an insulation section provided on the external connection area and having a side surface at a position of a boundary between the organic EL section arrangement area and the external connection area,
wherein the clearance is located above the insulation section.

3. The organic EL element according to claim 1,
further comprising an insulative moisture absorbing section provided between the second electrode section and the conductive member and configured to cover the clearance.

4. The organic EL element according to claim 3,
wherein the moisture absorbing section further covers a side surface of the second electrode section on a side of the conductive member.

5. The organic EL element according to claim 1,
wherein the sealing member is located above the organic EL section, and
wherein the width of the sealing member is longer than a width of the organic EL section in the predetermined direction.

6. A production method for producing an organic EL element, the organic EL element comprising a first electrode section, an organic EL section provided on the first electrode section and including a light-emitting layer, and a second electrode section provided on the organic EL section and configured to supply electric power to the organic EL section in conjunction with the first electrode section,
the production method comprising:
an organic EL section forming step of forming the organic EL section on an organic EL section arrangement area that is a part of the first electrode section, while an electrode-attached substrate having a main surface of a supporting substrate on which the first electrode section is provided is conveyed in a first direction;
a conductive film forming step of forming a band-shaped conductive film on the main surface of the electrode-attached substrate along the first direction so as to cover the organic EL section and at least a part of an external connection area arranged so as to come in contact with the organic EL section arrangement area in the first electrode section in a second direction that is substantially orthogonal to the first direction, while the electrode-attached substrate subjected to the organic EL section forming step is conveyed in the first direction;
a separation step of removing the conductive film in a predetermined area in the second direction to separate in an insulated manner the conductive film into a first part that is the second electrode section and a second part arranged on the external connection area, and to form a groove section extending in the first direction, while the electrode-attached substrate subjected to the conductive film forming step is conveyed in the first direction; and
a bonding step of bonding a band-shaped sealing member on the first part, the second part and the groove section, while the electrode-attached substrate subjected to the separation step is conveyed in the first direction,
wherein the predetermined area is set such that the groove section causes the first part and the external connection area to be insulated and separated from each other,
wherein a width of the sealing member is shorter than a width of the supporting substrate in the second direction, and
wherein, when the organic EL element is viewed from a thickness direction thereof, a side of an end of the first part opposite to the groove section and a side of an end of the second part opposite to the groove section in the second direction are exposed from the sealing member.

7. The production method for producing an organic EL element according to claim 6,
wherein one end of the predetermined area on a side of the organic EL section arrangement area in the second direction is located on a boundary between the organic EL section arrangement area and the external connection area.

8. The production method for producing an organic EL element according to claim 6, the production method further comprising an insulation section forming step of forming an insulation section on the external connection area such that a side surface is located on a boundary between the organic EL section arrangement area and the external connection area in the first electrode section, wherein, in the conductive film forming step, the conductive film is formed on the main surface along the first direction so as to cover the organic EL section, the insulation section and at least a part of the external connection area, while the electrode-attached substrate on which the insulation section and the organic EL section are formed is conveyed in the first direction, and the predetermined area is located on the insulation section.

9. The production method for producing an organic EL element according to claim 6, wherein in the separation step, the groove section is formed by irradiating the conductive film with a laser beam.

10. The production method for producing an organic EL element according to claim 6, the production method further comprising a moisture absorbing section forming step of forming an insulative moisture absorbing section in the groove section so as to cover an area exposed due to the groove section in the organic EL section.

11. The production method for producing an organic EL element according to claim 10, wherein in the moisture absorbing section forming step, the moisture absorbing section is formed so as to further cover a side surface that forms the groove section in the second electrode section.

12. The production method for producing an organic EL element according to claim 10, wherein the bonding step is performed after the moisture absorbing section forming step.

13. The production method for producing an organic EL element according to claim 6, wherein the sealing member is located above the organic EL section, and wherein the width of the sealing member is longer than a width of the organic EL section in the second direction.

* * * * *